United States Patent
Nakanishi et al.

(10) Patent No.: US 6,808,316 B2
(45) Date of Patent: Oct. 26, 2004

(54) OPTICAL COMMUNICATION MODULE

(75) Inventors: Hiromi Nakanishi, Osaka (JP); Yoshiki Kuhara, Osaka (JP); Takeshi Okada, Osaka (JP); Yoichiro Yamaguchi, Osaka (JP); Takeshi Fujimoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 215 days.

(21) Appl. No.: 10/176,355

(22) Filed: Jun. 21, 2002

(65) Prior Publication Data

US 2003/0002820 A1 Jan. 2, 2003

(30) Foreign Application Priority Data

Jun. 29, 2001 (JP) ........................................ 2001-198805
Aug. 6, 2001 (JP) ........................................ 2001-237888
Dec. 5, 2001 (JP) ........................................ 2001-371973

(51) Int. Cl.[7] ............................................... G02B 6/36
(52) U.S. Cl. .............................. 385/88; 385/92; 385/94
(58) Field of Search .............................. 385/88, 92, 94, 385/96.2; 264/1.25

(56) References Cited

U.S. PATENT DOCUMENTS 4,737,008 A * 4/1988 Ohyama et al. ............... 385/93
6,220,764 B1 * 4/2001 Kato et al. ..................... 385/92

FOREIGN PATENT DOCUMENTS

JP  10-154849  6/1998
JP  10154849 A  * 6/1998 ............. H01S/3/18

OTHER PUBLICATIONS

English abstract for Japanese patent cited above JP 10154849 A.*

* cited by examiner

Primary Examiner—Dean A. Reichard
Assistant Examiner—Jinhee Lee
(74) Attorney, Agent, or Firm—Smith, Gambrell & Russell, LLP

(57) ABSTRACT

An optical communication module includes (a) at least one light-emitting device, at least one light-receiving device, or a combination of these; (b) an optically coupling means coupled optically with the device or each device; (c) an electric-circuit part connected to the device or each device; (d) multiple layers of electroconductive media supporting the device or devices, the optically coupling means or these optically coupling means, and the electric-circuit part or parts; and (e) a connector portion formed at the end portion of each of the electroconductive media. The insertion of the next-stage circuit substrate between the connector portions enables the electrical connection between the module and the next-stage circuit substrate having a multitude of leads without requiring a large space. An insulating spacer placed between the layers of the electroconductive media secures the electrical and thermal insulation. The module has a property of high-speed response.

20 Claims, 20 Drawing Sheets

DIRECTION OF INSERTION

DIRECTION OF INSERTION

FIG.6(C)    Heating

FIG.6(E)    Heating

DIRECTION OF INSERTION

DIRECTION OF INSERTION

OPTICAL COMMUNICATION MODULE

DEFINITION OF THE TERM

In this specification, the term "lead" is used to mean "a conductor by which one circuit element is electrically connected to another," not the metal "lead" expressed by the symbol Pb.

BACKGROUND OF THE INVENTION

1. Field of the Invention

The present invention relates to an optical transmitter module, an optical receiver module, and an optical transceiver module that is constituted by combining the other two modules. In this specification, these three modules are generically referred to as optical communication modules.

2. Description of the Background Art

FIG. 19 is a partially cutaway perspective view showing the cross-sectional structure of a laser diode transmitter currently in use. A laser diode (LD) 10 and a monitor photodiode (M-PD) 15, which monitors the intensity of the light transmitted by the LD 10, are placed in the package. Optical signals transmitted by the LD 10 enter an optical fiber 61 through a lens 60. Such an optical communication module is called a pigtail-type module because of its outward appearance. As shown in FIG. 20, a pigtail-type module 100 connected with a circuit substrate provided with a driver IC 20 and a C-R element 25, requires the leads of the laser diode transmitter to be bent to solder them to the circuit substrate.

Recent developments in optical communication technology requir smaller, less costly, and mass-producible optical communication apparatuses. In the conventional structures shown in FIGS. 19 and 20, the LD is produced separately from the circuit substrate provided with the driver IC and other related devices. This production method has unsatisfactory limitations in miniaturization, cost reduction, and mass production. The structure causes the connection between the LD and the circuit substrate to be performed solely by hand soldering. This connection method prevents the improvement in the production efficiency.

The major factor causing the laser diode transmitter and the circuit substrate to be produced separately from each other is that there is no satisfactory means for electrically connecting the LD and the circuit substrate in a limited space at the time of the integration of the LD and the circuit substrate. The laser diode transmitter shown in FIG. 19 allows no more than four leads to be connected. On the other hand, at least 8 leads (sometimes 14 leads or more) are required when the leads for the IC for driving the LD are included.

Another reason for the separate production is that there is no satisfactory means for providing concurrently electrical insulation and thermal insulation at the time of the integration of the LD and the circuit substrate.

SUMMARY OF THE INVENTION

In order to solve the above-described problems, the principal object of the present invention is to offer an optical communication module that can be electrically connected in a limited space with the next-stage circuit substrate having a multitude of leads. Another object is to offer an optical communication module that can secure the electrical insulation and thermal insulation between the optoelectronic device, such as a light-emitting device and a light-receiving device, and the electric-circuit part and that has a property of high-speed response. Yet another object is to offer a particular method of connecting the optical communication module with the next-stage circuit substrate. This method eliminates the above-mentioned hand soldering, stabilizes the amount of the solder supplied to individual soldering places, effectively improves the quality of soldering, effectively reduces the cost, and facilitates mass production.

An optical communication module of the present invention has the following structure:
(a) A plurality of electroconductive media are provided. Each of the electroconductive media has a plurality of electroconductive pins, forms a multilayer structure with the other electroconductive medium or media, and protrudes from the main body of the optical communication module.
(b) At least one optoelectronic device selected from the group consisting of at least one light-emitting device and at least one light-receiving device is supported by one of the electroconductive media.
(c) An electric-circuit part being supported by one of the electroconductive media is connected to the optoelectronic device or each optoelectronic device.
(d) An optically coupling means supported by one of the electroconductive media is coupled optically with the optoelectronic device or each optoelectronic device.

The module may further have the structure that a connector portion is formed at the end portion of each of the electroconductive media to be connected to the next-stage circuit substrate.

The electroconductive media may be lead frames. The optically coupling means may be an optical fiber. A guiding structure that prevents the next-stage circuit substrate from shifting in a direction perpendicular to the protruding direction of the electroconductive media may be provided.

The module may have the following feature:
(a) The optically coupling means is an optical fiber inserted into a ferrule (hereinafter referred to as a ferruled optical fiber).
(b) The electroconductive media are two layers of lead frames.
(c) The connector portion is formed such that the next-stage circuit substrate can be securely inserted between the end portions of the lead frames.

The module may have a structure in which an Si platform supported by one of the electroconductive media is provided, and one end of a ferruled optical fiber is fixed on the Si platform together with an optoelectronic device.

The module may have the following feature:
(a) The light-emitting device is a laser diode (hereinafter referred to as an LD).
(b) The electric-circuit part connected to the LD is a driver IC.

The module may have the following feature:
(a) The light-receiving device is a photodiode (hereinafter referred to as a PD).
(b) The electric-circuit part connected to the PD is a signal amplifier.

The module may have the following feature:
(a) A signal-transmitting portion comprises at least one combination of an LD and a driver IC.
(b) A signal-receiving portion comprises at least one combination of a PD and a signal amplifier.

The module may have the following structure:
(a) An LD and an optical fiber coupled optically with the LD are supported by a part of a first lead frame.

(b) A driver IC is supported by a part of a second lead frame.

(c) A combination of the LD, the optical fiber coupled optically with the LD, and the driver IC forms a signal-transmitting portion.

(d) A PD and an optical fiber coupled optically with the PD are supported by the remaining part of the first lead frame.

(e) A signal amplifier is supported by the remaining part of the second lead frame.

(f) A combination of the PD, the optical fiber coupled optically with the PD, and the signal amplifier forms a signal-receiving portion.

(g) A resin-molding portion encloses the signal-transmitting portion and the signal-receiving portion for forming a package.

(h) A connector portion formed at the end portion of each lead frame protrudes from the package.

The module may have the following feature:

(a) At least one light-emitting device, at least one light-receiving device, or both are supported by a first electroconductive medium;

(b) At least one electric-circuit part is supported by a second electroconductive medium; and (c) An electric insulator is sandwiched between the first and second electroconductive media.

The module may have the feature of having at least three layers of the electroconductive media. The module may have the feature of having at least two optoelectronic devices. The electroconductive media may be metal lead frames.

The module may have the following feature:

(a) The module further comprises at least one Si platform.

(b) At least one light-emitting device, at least one light-receiving device, or both are supported by a first electroconductive medium through the Si platforms.

(c) At least one electric-circuit part is supported directly by a second electroconductive medium.

(d) An electric insulator sandwiched between the first and second electroconductive media has a thermal insulation property.

The module may have the following feature:

(a) At least two light-emitting devices are incorporated into the module.

(b) The light-emitting devices are LDs.

(c) The electric-circuit parts connected to the LDs are driver ICs.

The module may have the following feature:

(a) At least two light-receiving devices are incorporated into the module.

(b) The light-receiving devices are PDs.

(c) The electric-circuit parts connected to the PDs are signal amplifiers.

A first electroconductive medium and a second electroconductive medium may protrude in a direction different from each other.

An optical communication module of the present invention has the following structure:

(a) A plurality of electroconductive media are provided. Each of the electroconductive media has a plurality of electroconductive pins, forms a multilayer structure with the other electroconductive medium or media, and protrudes from the main body of the module.

(b) A light-emitting device and a light-receiving device are supported by one of the electroconductive media.

(c) An electric-circuit part supported by one of the electroconductive media is connected to each of the light-emitting device and the light-receiving device.

(d) An optical wavelength demultiplexer is supported by one of the electroconductive media.

(e) An optical fiber supported by one of the electroconductive media is coupled optically with the light-emitting device and the light-receiving device through the optical wavelength demultiplexer.

(f) A connector portion is formed at the end portion of each of the electroconductive media to be connected to the next-stage circuit substrate.

The foregoing module equipped with an optical wavelength demultiplexer may have the following additional structure:

(a) An Si platform is supported by one of the electroconductive media.

(b) One end of the optical fiber is fixed on the Si platform together with the light-emitting device and the light-receiving device.

In the present invention, a method of connecting an optical communication module with the next-stage circuit substrate comprises the following steps:

(a) providing an optical communication module comprising:

(a1) a multiple layers of electroconductive media;

(a2) at least one optoelectronic device selected from the group consisting of at least one light-emitting device and at least one light-receiving device, the optoelectronic device or each optoelectronic device being supported by one of the electroconductive media;

(a3) an electric-circuit part connected to the optoelectronic device or each optoelectronic device, the optoelectronic device or each electric-circuit part being supported by one of the electroconductive media;

(a4) an optically coupling means coupled optically with the optoelectronic device or each optoelectronic device, the optoelectronic device or each optically coupling means being supported by one of the electroconductive media; and (a5) a connector portion formed at the end portion of each of the electroconductive media;

(b) forming solder bumps at a connecting portion of the next-stage circuit substrate to be connected with the optical communication module;

(c) fitting the connecting portion of the next-stage circuit substrate between the connector portions of the optical communication module; and (d) connecting the fitted portion by soldering accompanied by non-contact heating.

The soldering may be performed by reflow soldering. The solder bumps may be formed concurrently by the heat for soldering electrical components onto the next-stage circuit substrate. The testing of the optical communication module may be conducted by tentatively connecting it with a testing substrate before the step of fitting.

The connecting method may have the following additional steps:

(a) resin-molding the optical communication module so as to provide the structure of a package, with the end portions of the electroconductive media protruding from the package, before the step of fitting; and (b) subsequently to the step of connecting, resin-encapsulating the exposed portions of the electroconductive media between the package and the next-stage circuit substrate.

BRIEF DESCRIPTION OF THE DRAWINGS

In the drawings:

FIGS. 5(A) and 5(B) show the procedure for connecting an optical communication module of the present invention with a circuit substrate, in which FIG. 5(A) is the side view, and FIG. 5(B) is the plan view;

FIGS. 6(A) to 6(E) illustrate the process for connecting an optical communication module with the next-stage circuit substrate;

FIGS. 16(A) and 16(B) show the procedure for the connection between an optical communication module of the present invention incorporating two optical fibers and a circuit substrate, in which FIG. 16(A) is the side view, and FIG. 16(B) is the plan view;

DETAILED DESCRIPTION OF THE INVENTION

Figure 1:
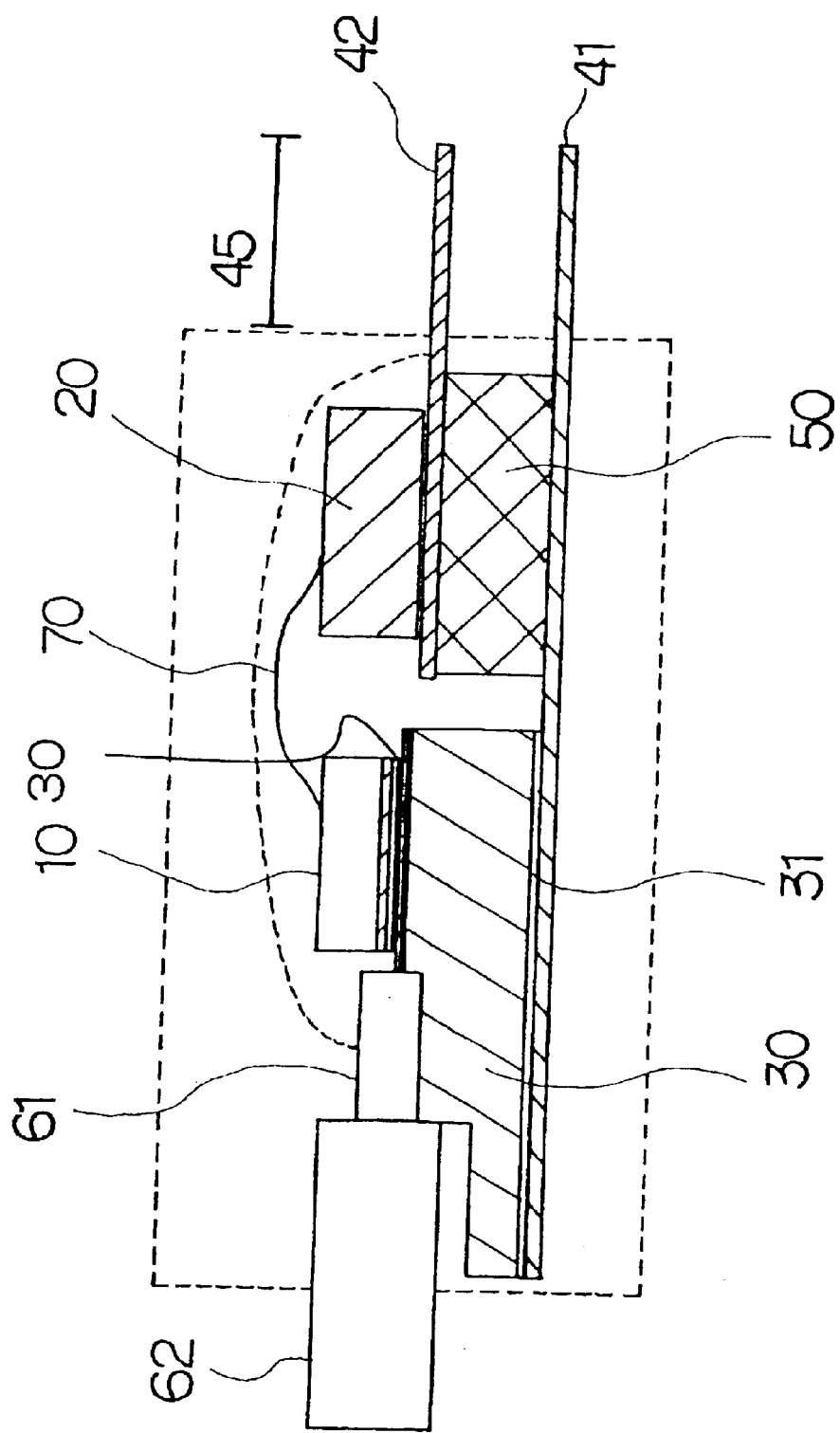
FIG. 1 is a longitudinal cross section of an optical transmitter module of the present invention having two layers of lead frames.

The present invention accomplishes the above-described principal object by using multiple layers of electroconductive media. More specifically, an optical communication module of the present invention includes the following components:

(a) multiple layers of electroconductive media each of which:
  (a1) has a plurality of electroconductive pins; and
  (a2) protrudes from the main body of the module;

(b) at least one optoelectronic device selected from the group consisting of at least one light-emitting device and at least one light-receiving device, the optoelectronic device or each optoelectronic device being supported by one of the electroconductive media;

(c) an optically coupling means coupled optically with the optoelectronic device or each optoelectronic device, the optoelectronic device or each optically coupling means being supported by one of the electroconductive media; and (d) an electric-circuit part connected to the optoelectronic device or each optoelectronic device, the optoelectronic device or each electric-circuit part being supported by one of the electroconductive media.

The module may also include a connector portion that;

(a) is formed at the end portion of each of the electroconductive media; and (b) is to be connected to the next-stage circuit substrate.

The multilayer structure of the electroconductive media enables the mounting of a multitude of optoelectronic devices and electric-circuit parts. (The conventional single-layer structure has difficulty in mounting a multitude of such components.) Because each of the electroconductive media itself forms a connector portion to be connected to the next-stage circuit substrate, the electrical connection between the optoelectronic devices and the next-stage circuit substrate having a multitude of leads can be performed in a small space.

Considering the thermal insulation, the optoelectronic device and the electric-circuit part should be placed at a mutual distance of sufficient interval. However, the following more important requirement prevents such a spacious design. The increase in the transmission rate of signals requires the decrease in the impedance of the connecting circuits between the optoelectronic device and the electric-circuit part to enable the high-speed response. The impedance can be reduced by placing the two components at the shortest possible mutual distance. Therefore, the electric-circuit part is housed in a small package. This miniaturization, however, causes the conventional package to become short of lead pins for forming the interface with the outside circuit. In order to meet the mutually contradictory requirements, the present invention employs a multilayer structure of electroconductive media.

When a plurality of electroconductive media are layered, the electric-circuit part can be placed in close proximity to the optoelectronic device, while securing the number of circuits for the electrical connection with the next-stage circuit substrate. The layered structure of the electroconductive media enables ample provision of lead pins so that unconnected lead pins can be used for heat dissipation. The protruding direction of the lead pins of the electroconductive media can be determined without restriction.

A light-emitting device, a light-receiving device, and an electric-circuit part may be supported in combination by the same electroconductive medium or may be supported individually by a different electroconductive medium.

It is desirable to use a metal lead frame as the electroconductive medium. There may be two or more lead frames.

In addition, a plurality of light-emitting devices, light-receiving devices, and electric-circuit parts may be supported by the electroconductive media.

The types of optical coupling means include an optical fiber. A ferruled optical fiber is ordinarily used.

The types of optical communication modules include an optical transmitter module, an optical receiver module, and an optical transceiver module. A typical optical transmitter module comprises an LD as the light-emitting device and a driver IC for the LD as the electric-circuit part. The optical transmitter module may further comprise an M-PD, which monitors the intensity of the LD. A typical optical receiver module comprises a PD as the light-receiving device and an amplifier for amplifying the signal of the PD as the electric-circuit part. A typical optical transceiver module comprises at least one combination of a light-emitting device and a driver IC and at least one combination of a light-receiving device and an amplifier.

A more specific structure of an optical transceiver module is as follows:

Its signal-transmitting portion comprises:
(a) an LD supported by a part of a first lead frame;
(b) an optical fiber for transmitting signal, which is coupled optically with the LD; and
(c) a driver IC supported by a part of a second lead frame.

Its signal-receiving portion comprises:
(a) a PD supported by the remaining part of the first lead frame;
(b) an optical fiber for receiving signal, which is coupled optically with the PD; and
(c) the PD's signal amplifier supported by the remaining part of the second lead frame.

It is desirable that the signal-transmitting portion and the signal-receiving portion be resin-molded as a package and that the end portions of the lead frames protruding from the package be used as connector portions.

In the present invention, at least one optoelectronic device selected from the group consisting of at least one light-emitting device and at least one light-receiving device and an electric-circuit part connected to the optoelectronic device or each optoelectronic device are supported by a plurality of electroconductive media either directly or indirectly through a material such as an Si platform.

A desirable specific structure is as follows:
(a) A first electroconductive medium and a second electroconductive medium are layered through an electric insulator.
(b) At least one of a light-emitting device and a light-receiving device is supported by the first electroconductive medium.
(c) At least one electric-circuit part, such as a driver IC or an amplifier, is supported by the second electroconductive medium.

In this case, it is desirable that at least one of the light-emitting device and the light-receiving device be supported by the first electroconductive medium through an Si platform. Because Si has a superior heat conductive property, the heat generated by the light-emitting device and the light-receiving device can be effectively dissipated from the first electroconductive medium through the Si platform. In addition, the Si platform allows the easy formation of a V-shaped groove by etching for supporting an optical fiber. Consequently, an end of the optical fiber can be easily fixed on the Si platform.

It is desirable that an electric-circuit part be supported directly by a second electroconductive medium separated from a first electroconductive medium. This direct support enables the prompt dissipation of the heat generated by the electric-circuit part through the second electroconductive medium.

It is desirable that an electric insulator placed between a first electroconductive medium and a second electroconductive medium have a thermally insulating property. In addition to the secure electrical insulation between the first and second electroconductive media by the electric insulator, the thermal insulation between the two media can also be secured by using a material having both electrically insulating and thermally insulating properties as the electric insulator. For example, when (a) at least one of a light-emitting device and a light-receiving device is supported by the first electroconductive medium, (b) at least one electric-circuit part is supported by the second electroconductive medium, and (c) an electrically and thermally insulating material is placed between the two electroconductive media, the flow of the heat generated by the electric-circuit or each electric-circuit part to the first electroconductive medium is suppressed by the electrically and thermally insulating material, inhibiting the flow of heat into the light-emitting device, the light-receiving device, or both, which are temperature-sensitive. As described above, the layering of the first and second electroconductive media secures the electrical and thermal insulation between the optoelectronic device and the electric-circuit part even though the two components are placed in close proximity.

The direction of the protrusion of the first and second electroconductive media can be determined without restrictions. They may protrude in the same direction or in different directions. When the direction differs, it is desirable that the two electroconductive media protrude in a direction perpendicular to each other.

The present invention also offers an optical communication module in which one optical fiber is used for both transmission and reception of signals. In this module, one optical fiber is coupled optically with a light-emitting device and a light-receiving device through an optical wavelength demultiplexer. This structure enables the signal transmission between the light-emitting device and the optical fiber and between the optical fiber and the light-receiving device.

The connector portion is formed such that the next-stage circuit substrate is fitted between the two electroconductive media. The connection between the connector portion and the next-stage circuit substrate is performed by the reflow soldering method accompanied by infrared heating.

The connector portion of an optical communication module of the present invention is formed such that the internal distance between the opposing electroconductive media is slightly smaller than the thickness of the next-stage circuit substrate. This structure relies on the elasticity of the electroconductive media in preventing the easy displacement of the circuit substrate once the circuit substrate is inserted between the connector portions. In particular, when convex portions are formed at the inside of the opposing electroconductive media, the elasticity of the electroconductive media can easily be utilized. The convex portion can be formed either by bending the electroconductive medium itself to obtain a proper form or by attaching a small rounded piece of electroconductive material onto a straight electroconductive medium to form a projected part. In addition, when concave portions are formed at the contacting points of the next-stage circuit substrate such that the concave portions fit the convex portions of the connector portion, the reliability of the connection between the connector portion and the next-stage circuit substrate can be further heightened.

It is desirable to provide a guide structure that prevents the next-stage circuit substrate from shifting in a direction perpendicular to the protruding direction of the electroconductive media. When the connector portion has a structure in which the next-stage circuit substrate is inserted between the electroconductive media, the displacement of the circuit substrate in the protruding direction of the electroconductive media can be prevented. However, the circuit substrate can still shift in a direction perpendicular to the protruding direction of the electroconductive media. This movement can be prevented by the above-described guide structure. Therefore, the guide structure provides secure connection between the connector portion and the circuit substrate. More specifically, it is desirable to form a pair of guide grooves in a package of the optical communication module. An optical communication module usually has the structure of a package that encloses by resin-molding the light-emitting device, light-receiving device, electric-circuit parts, and optically coupling means. The electroconductive media protrude from the package to form the connector portion. When a pair of guide grooves are formed in the package such that the distance between the opposite innermost walls of the guide grooves corresponds to the width of the end portion of the circuit substrate, the guide grooves can prevent the movement of the circuit substrate in the lateral direction, a direction perpendicular to the protruding direction of the electroconductive media.

In the present invention, the connection between an optical communication module and the next-stage circuit substrate is performed through the following steps:

(a) a step for providing an optical communication module in which at least one optoelectronic device selected from the group consisting of at least one light-emitting device and at least one light-receiving device, an electric-circuit part connected to the optoelectronic device or each optoelectronic device, and an optically coupling means coupled optically with the or each optoelectronic device are supported by a plurality of layers of electroconductive media;

(b) a step for forming solder bumps at the connecting portion of the next-stage circuit substrate to be connected with the optical communication module;

(c) a step for fitting the connecting portion of the next-stage circuit substrate between the connector portions formed at the end portions of the electroconductive media; and (d) a step for connecting the fitted portion by soldering accompanied by non-contact heating.

Employing the soldering method accompanied by non-contact heating, a connecting method of the present invention can further stabilize the heating temperature and time in the connection between the optical communication module and the next-stage circuit substrate in comparison with the conventional method. It is desirable to use the reflow soldering method as the soldering method accompanied by non-contact heating. It is desirable that the heating method for the soldering be the infrared heating method, the hot-air heating method, or the combination of these.

The next-stage circuit substrate is provided in advance with solder bumps formed at the portion to be connected with the optical communication module. When paste-like cream solder is printed in place of the solder bumps for the connection with the connector portion of the optical communication module, the cream solder may spread while the next-stage circuit substrate is fitted between the connector portions. As a result, neighboring connecting points may be short-circuited. When the hand-soldering method is employed, it is difficult to maintain the constant amount of the solder supplied to the connecting places where minute pitches are required. On the other hand, the solder bumps are solidified before the next-stage circuit substrate is fitted between the connector portions. Therefore, no solder spreads. The solder-bump method is effective in preventing the short-circuiting. The use of a metal mask having a uniform thickness and openings can stabilize the amount of the supplied solder even with minute pitches.

It is desirable that the solder bumps be formed concurrently by the heat for soldering the specified electrical components onto the next-stage circuit substrate. More specifically, when cream solder is printed on the next-stage circuit substrate for mounting the electrical components, not only is the cream solder for the electrical components printed but also the cream solder for the portion for connecting with the optical communication module is printed. The subsequent heating for soldering the electrical components onto the next-stage circuit substrate concurrently forms the solder bumps at the connecting portion of the next-stage circuit substrate where no electrical components are mounted. The formation of the solder bumps by this method eliminates the solder-supplying operation at the time of the connection between the optical communication module and the next-stage circuit substrate. As a result, the step for the connection solely performs the heating of the solder, thereby increasing the efficiency of the operation.

It is desirable to test an optical communication module of the present invention by tentatively connecting it with a testing circuit substrate before completely connecting it with the next-stage circuit substrate. It is desirable that the testing circuit substrate have the same connection mechanism as that of the next-stage circuit substrate. Because the module can be disconnected from the testing circuit substrate, the modules can be tested in advance to eliminate defective modules so that only the satisfactory modules can be completely connected. Consequently, unproductive production steps can be minimized.

It is desirable to prepare an optical communication module provided with the structure of a package by resin-molding and to resin-encapsulate the exposed portions of the electroconductive media between the package and the next-stage circuit substrate. The connector portion at the end of each of the layered electroconductive media protrudes from the main body of the packaged module and is exposed. After the connection between the module and the next-stage circuit substrate, the exposed portions still remain at the outer surface and between the layers of the electroconductive media. In the present invention, the exposed portions are encapsulated by resin. This resin encapsulation facilitates the impedance matching between the packaged module and the next-stage circuit. As a result, the reflection of electric currents at the circuit boundaries is reduced and the combined structure becomes more suitable for high-speed operation.

In order to facilitate the foregoing impedance matching, it is desirable that the resin for the encapsulation have a dielectric constant comparable to that of the resin for the packaging of the module. In other words, it is desirable to use resin similar to the resin used for the packaging. More specifically, the resin for the encapsulation may have a dielectric constant being 80 to 120% of that of the resin for the packaging. For example, when epoxy resin (the dielectric constant is about 4.0) is used for the packaging, it is desirable to use, as the resin having a comparable dielectric constant, liquid crystal polymer resin (the dielectric constant is about 3.9, which is 97.5% of that of epoxy resin) or polyimide resin (the dielectric constant is about 3.5, which is 87.5% of that of epoxy resin).

The resin encapsulation may be applied only to the exposed portions of the electroconductive media. However, it is desirable that the resin encapsulation be performed so as to cover not only the exposed portions of the electroconductive media but also the connected portion between the package of the module and the next-stage circuit substrate.

Embodiments of the present invention are explained below by referring to the accompanying drawings. To avoid duplicated explanations, the same signs are allocated to the same members throughout the drawings.

EXAMPLE 1

Optical Transmitter Module Two Layers of Lead Frames

Figure 2:
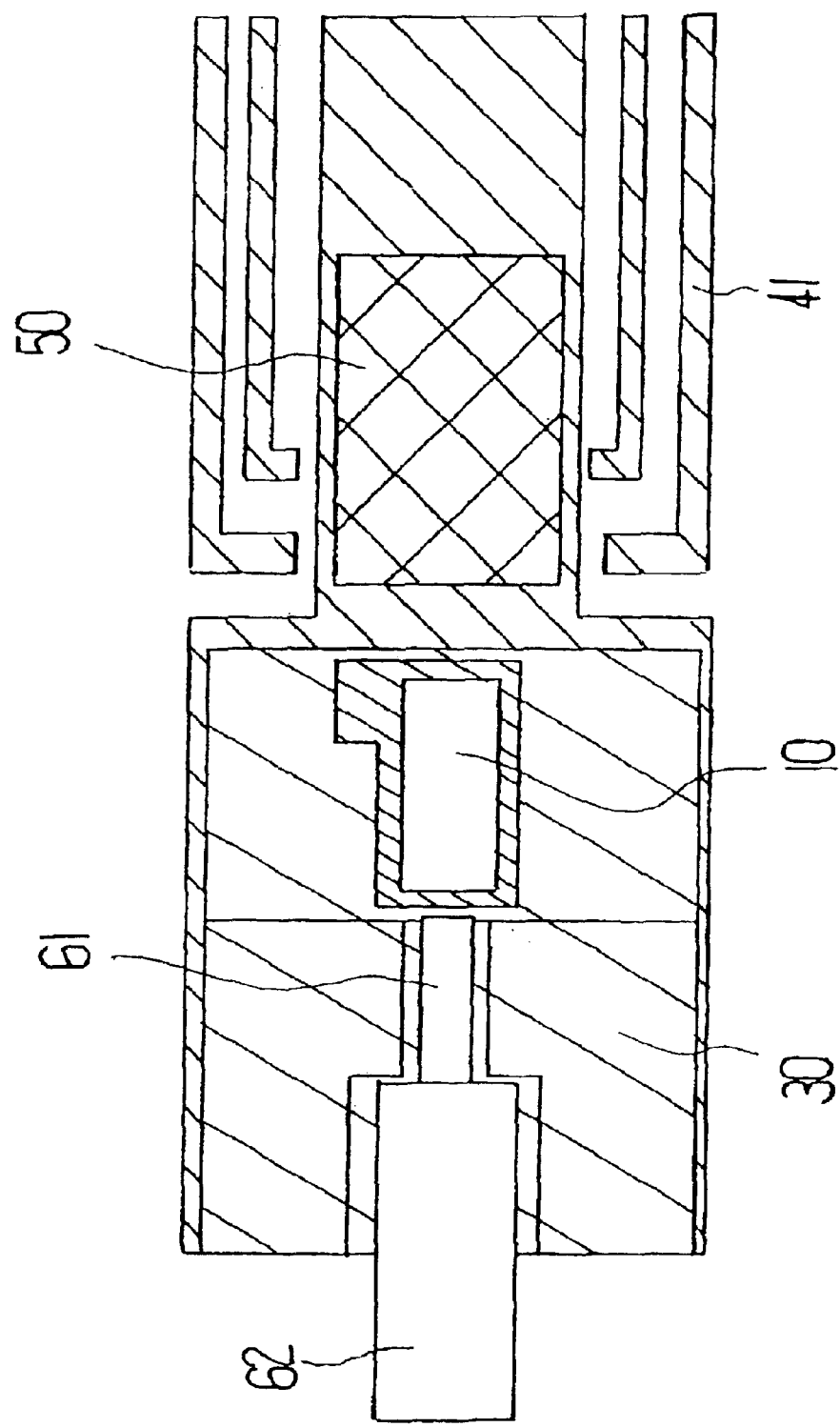
FIG. 2 is a plan view of the module shown in FIG. 1 from which the driver IC and the second lead frame are removed.
Figure 3:
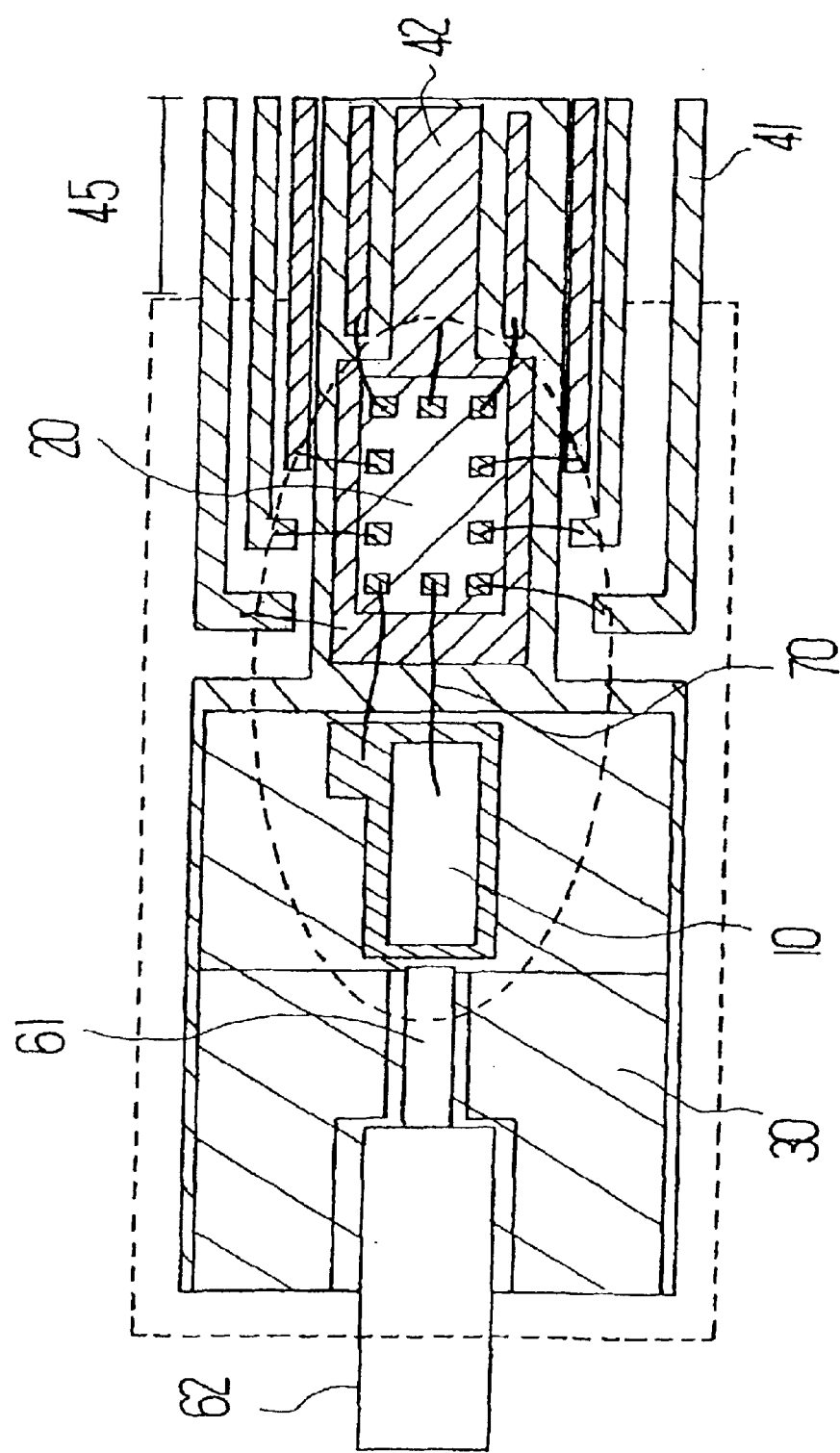
FIG. 3 is a plan view of the module shown in FIG. 1.

FIGS. 1 to 3 show an optical transmitter module of the present invention having two layers of lead frames. FIG. 1 is a longitudinal cross section of the module. FIG. 2 is a plan view of the module shown in FIG. 1 from which the driver IC and the second lead frame are removed. FIG. 3 is a plan view of the module shown in FIG. 1.

The optical transmitter module is equipped with an LD 10, which is a light-transmitting device, and a driver IC 20, which is an electric-circuit part for driving the LD 10. The LD 10 is supported by a first lead frame 41 (a first electroconductive medium) through an Si platform 30. The driver IC 20 is supported directly by a second lead frame 42 (a second electroconductive medium) that overlaps the first lead frame 41. An insulating spacer 50 (an electrical insulator) is placed between the first and second lead frames. A shallow V-shaped groove and a deep V-shaped groove are continuously formed on the Si platform 30. An optical fiber 61 is fitted in the shallow V-shaped groove and an optical fiber ferrule 62 is fitted in the deep V-shaped groove.

The LD 10 usually has temperature-sensitive properties. A typical LD has an active layer made of InGaAsP grown on an InP substrate. Therefore, it is desirable to minimize the heat from the driver IC 20, especially an IC made with Si or GaAs. On the other hand, the decrease in the distance between the LD 10 and the driver IC 20 enables faster operations. Consequently, as shown in FIG. 1, the LD 10 is placed on the first lead frame 41 and the driver IC 20 is placed on the second lead frame 42.

Such an optical transmitter module can be produced by the process explained below. The two layers of the lead frames 41 and 42 are placed at a specified mutual distance, in this case about one millimeter, using the insulating spacer 50 made of a high-polymer insulating material having low thermal conductivity and good electrical insulation. It is desirable that the insulating spacer 50 be made of a liquid crystal polymer and that the lead frames 41 and 42 be made of Fe, Cu, or Al.

The LD 10 is placed on the Si platform 30, which acts as both a heat sink and a submount. The Si platform 30 is a semiconductor and allows an electric current to flow. Therefore, its top surface and back surface are provided with insulating layers 31 made of $SiO_2$ formed by thermal oxidation or chemical vapor deposition (CVD). The V-shaped grooves for fixing the optical fiber 61 and the optical fiber ferrule 62 and a metallized pattern for bonding the LD 10 are formed on the Si platform 30 by photolithography. The optical fiber ferrule 62 supporting the optical fiber 61 is made of zirconia or alumina.

As shown in FIG. 3, the bonding using Au wires 70 performs the connection between the LD 10 and the driver IC 20 and between the driver IC 20 and the lead frames 41 and 42. The LD 10, the driver IC 20, and the end portion of the optical fiber 61 are enclosed with, for example, a transparent silicone-family resin by using the encapsulation method. The resin provides the refractive-index matching with the optical fiber 61, the surface protection of the LD 10 and the driver IC 20, and the protection of the Au wires 70. The outside shape of the module is formed by molding with epoxy resin the entire module except the end portions of the two layers of the lead frames 41 and 42 and the end portion of the optical fiber ferrule 62. The rectangular broken lines in FIGS. 1 and 3 show the outline of the package produced by the resin molding. The curved broken lines covering the LD 10 and the driver IC 20 in FIGS. 1 and 3 show the outline of the encapsulation formed by the transparent resin.

Figure 4:
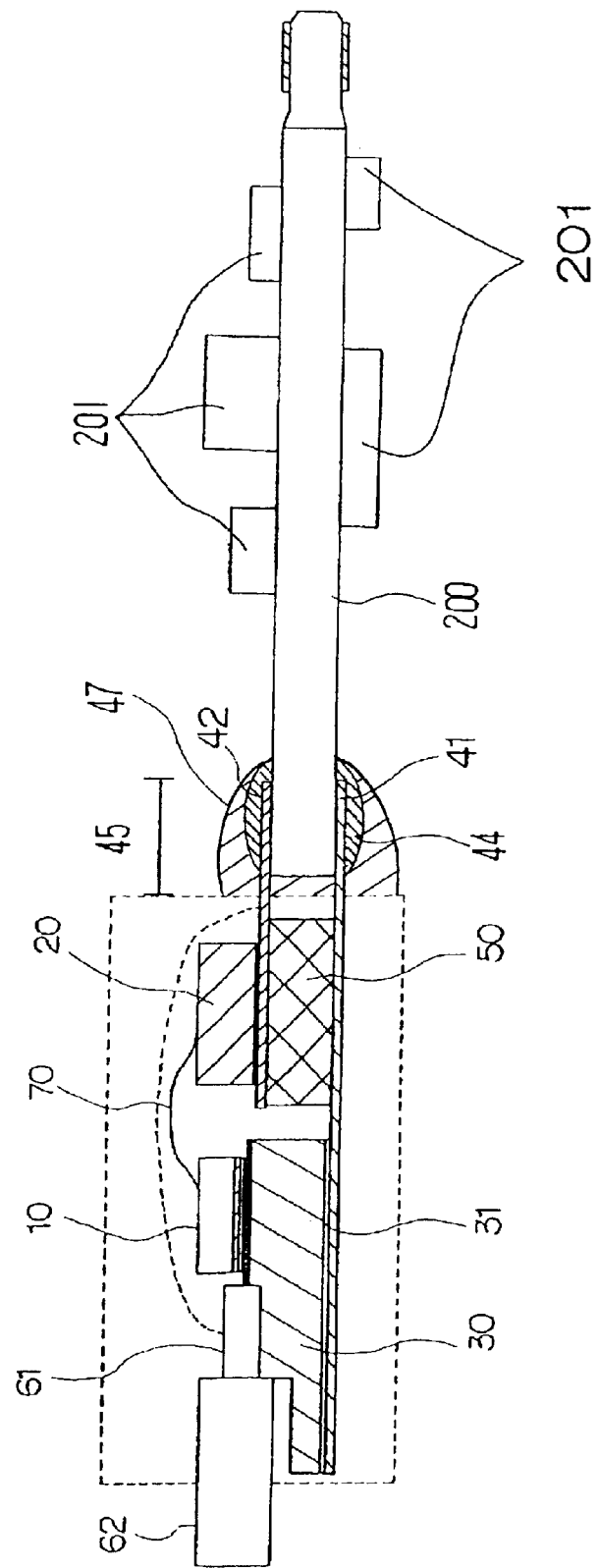
FIG. 4 is a longitudinal cross section showing the connection between an optical communication module of the present invention and a circuit substrate.

The lead frames' end portions projecting from the package are connector portions 45, which are used to connect the module with the next-stage circuit substrate. FIG. 4 is a longitudinal cross section showing the connection between the connector portions 45 and a circuit substrate 200. As shown in FIG. 4, the connection is performed by inserting the circuit substrate 200 between the connector portions 45.

The internal distance between the first lead frame 41 and the second lead frame 42 is slightly smaller than the thickness of the next-stage circuit substrate 200 to be inserted. This structure acting like a spring prevents the easy displacement of the circuit substrate 200 once the circuit substrate 200 is inserted between the connector portions 45. The top surface and back surface of the circuit substrate 200 are provided with metallized patterns. The metallized patterns are connected to electrical components 201 mounted on the circuit substrate 200 and extend to contactors 202 (see FIG. 5(B)), which provide the contact with the connector portions 45.

The contactors 202 are connected to the connector portions 45 by the below-described reflow soldering method accompanied by infrared beating. This operation forms soldering portions 44. The two layers of the lead frames 41 and 42 combine the functions of electrical connection and mechanical connection. The combined functions are made possible because of the dual-layer structure produced by the lead frames 41 and 42.

Figure 5:
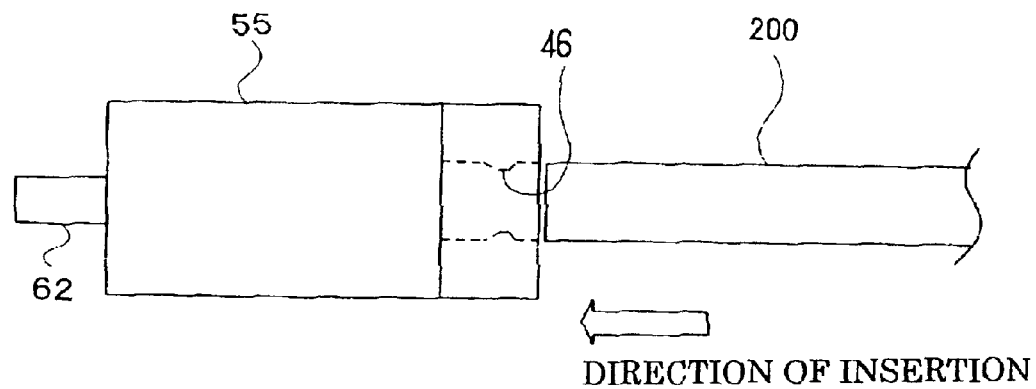
Figure 5:
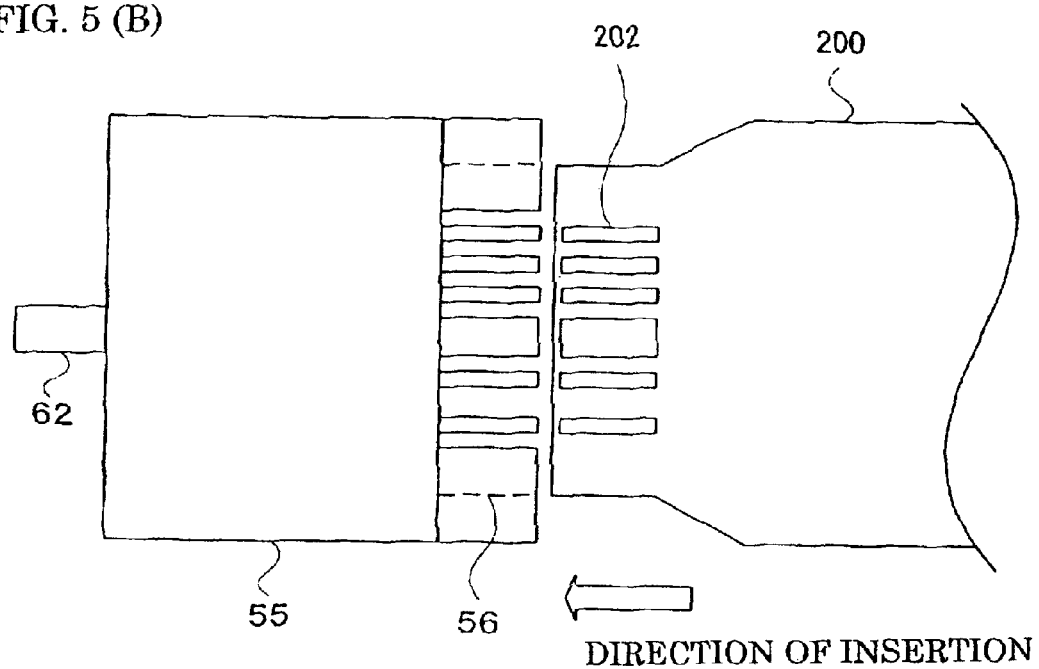

As shown in FIGS. 5(A) and 5(B), it is desirable to provide convex portions 46 at the lead frames in the connector portions and to provide guide grooves 56 in the package 55. FIGS. 5(A) and 5(B) show the procedure for connecting the optical communication module with the circuit substrate 200. FIG. 5(A) is the side view, and FIG. 5(B) is the plan view. As shown in FIG. 5(A), the lead frames 41 and 42 in the connector portions are partially bent to form the convex portions 46 facing the opposite lead frames. The circuit substrate 200 is held between the upper and lower lead frames. This structure prevents the longitudinal displacement of the circuit substrate 200.

In order to determine the position of the circuit substrate 200 in the lateral direction, a direction perpendicular to the protruding direction of the lead frames, the package is provided with the guide grooves 56 as shown in FIG. 5(B). The guide grooves 56 are formed when the package is formed. The distance between the opposite innermost walls of the guide grooves 56 corresponds to the width of the end portion of the circuit substrate 200. The guide grooves 56 precisely determine the position of the circuit substrate 200 in the lateral direction, enabling the secure connection between the connector portions 45 and the circuit substrate 200.

When a standard circuit substrate for testing is used as the next-stage circuit substrate 200, the module can be tested before being completely connected with a circuit substrate to be coupled. This method can detect defective modules in advance, eliminating unproductive processes and thereby contributing to a cost reduction.

As an alternative, a circuit substrate manufactured as the product can be coupled with the module to carry out the test before the complete connection by soldering. In this case, when the test proves the satisfactory operation, the subsequent reflow soldering completes the connection, and the article is sent to the mass-production line. This method is also effective.

The method of connecting an optical communication module of the present invention with the next-stage circuit substrate is explained in detail below, referring to FIGS. 6(A) to 6(E), which illustrate the process of this method.

Figure 6A:
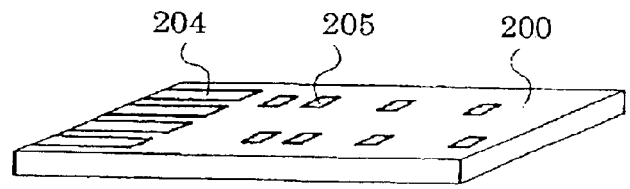
Figure 6B:
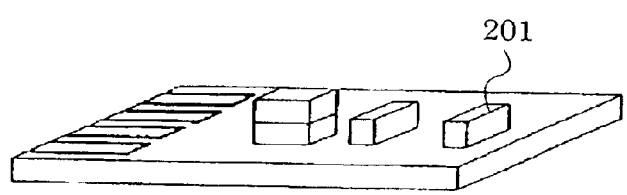
Figure 6B:
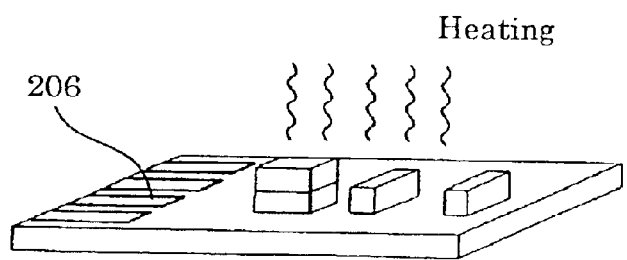

(1) Production of the Next-Stage Circuit Substrate 200:
① Step for printing solder (A): As shown in FIG. 6(A), cream solder is printed at connecting portions 204 to be connected with the connector portions 45 of the optical communication module 1 and at mounting portions 205 for mounting required electrical components 201 on one of the two main surfaces of the next-stage circuit substrate 200. It is desirable that the solder printing at the connecting portions 204 be carried out by using a metal mask having proper thickness and openings.
② Step for mounting the electrical components 201 (B): As shown in FIG. 6(B), the electrical components 201 are mounted on the mounting portions 205 where the cream solder is printed.
③ Step for soldering the mounting portions 205 and forming solder bumps (C): As shown in FIG. 6(C), the next-stage circuit substrate 200 on which the electrical components 201 are mounted is placed in a reflow-soldering furnace to carry out the soldering. Solder bumps 206 are concurrently formed at the connecting portions 204 in this step.

The other main surface of the next-stage circuit substrate 200 also undergoes steps ① to ③ above. This concludes the production of the next-stage circuit substrate 200 that has on its two main surfaces the solder bumps 206 formed at the connecting portions 204 and the electrical components 201.

(2) Performance Test of the Optical Communication Module 1:
Step for the performance test: The performance test is carried out by tentatively fitting the optical communication module 1 with a testing circuit substrate having the same function as that of the next-stage circuit substrate 200 to be connected. This test eliminates defective modules. The fitting method is explained below.

Figure 6D:
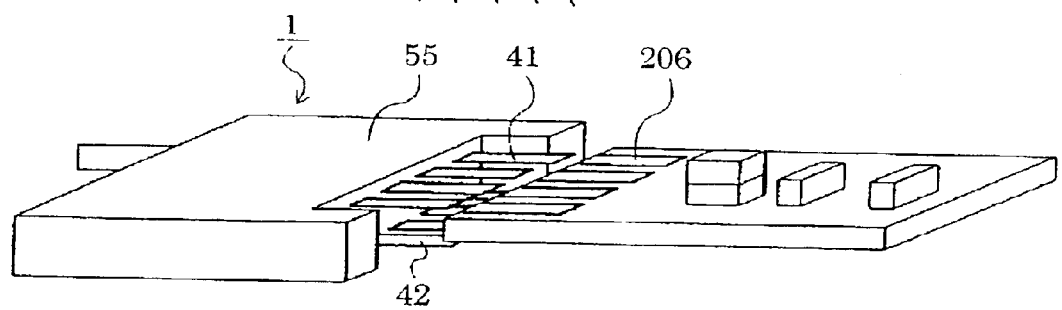
Figure 6D:
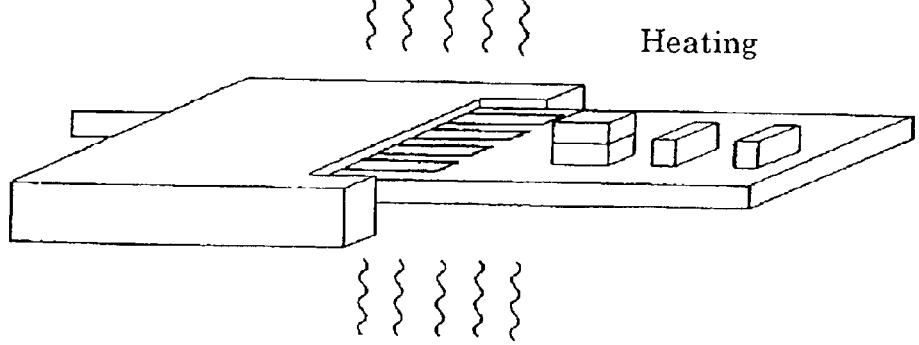

(3) Fitting of the Connecting Portions 204 of the Next-Stage Circuit Substrate 200 With the Connector Portions 45 of the Optical Communication Module 1:
Step for the fitting (D): As shown in FIG. 6(D), the next-stage circuit substrate 200 is inserted between the connector portions 45 of the first lead frame 41 and the second lead frame 42 of the module 1. The insertion is performed by sliding the circuit substrate 200 along the guide grooves provided in the package 55 of the module 1. The guide grooves are omitted in FIG. 6(D), although they are indicated in FIG. 5(B) by the numeral 56. The first lead frame 41 and the second lead frame 42 are overlaid on the solder bumps 206 on the circuit substrate 200. Thus, the module 1 is fitted with the circuit substrate 200.

(4) Solder-Bonding of the Fitted Portions of the Optical Communication Module 1 and the Next-Stage Circuit Substrate 200 by the Non-Contact Heating Method:
Step for solder-bonding (E): As shown in FIG. 6(E), the fitted portions of the module 1 and the circuit substrate 200 are securely connected by reflow soldering. It is desirable that the fitted portions be heated both from above and from below. It is desirable that the heating method be the infrared heating method, the hot-air heating method, or the combination of these.

In this example, the lead frames 41 and 42 of the module 1 have exposed portions between the main body of the module 1 and the circuit substrate 200. The exposed portions are enclosed by resin encapsulation. Step for the resin encapsulation: As shown in FIG. 4, the connector portions 45 protruding from the package of the module 1 have exposed portions between the package and the circuit substrate 200. The exposed portions are enclosed by the resin encapsulation method to form a resin-encapsulated portion 47. As can be seen from FIG. 4, the exposed portions are the underside of the first lead frame 41, the top side of the second lead frame 42, and the space between the first lead frame 41 and the second lead frame 42.

In this example, as described above, the resin-encapsulated portion 47 is formed so as to enclose the soldering portions 44 and the exposed portions of the lead frames 41 and 42. The resin-encapsulated portion 47 is formed by using epoxy resin, which is also used for the package of the module 1.

The dual-layer structure of the lead frames has the following advantages:
① The number of lead pins required for the connection with the next-stage circuit substrate can be secured.
② The short distance between the LD and the driver ID reduces the impedance of the wiring circuits, thereby facilitating high-speed transmissions at a rate of 1 Gbps or more.
③ The placement of the LD on the highly heat-conductive Si platform facilitates the heat dissipation to the outside through the first lead frame. The dual-layer structure of the lead frames enables ample provision of lead pins so that unconnected lead pins can be used for heat dissipation.
④ The direct placement of the driver IC on the second lead frame facilitates the heat dissipation to the outside.
⑤ Thermal isolation is provided between the first and second lead frames by the insulating spacer having low thermal conductivity. Consequently, the heat transferring from the driver IC to the second lead frame cannot flow into the temperature-sensitive LD through the first lead frame. As a result, the LD and the driver IC can be isolated both electrically and thermally.
⑥ The connector portions can also function as a means of mechanically connecting the next-stage circuit substrate.
⑦ The bonding between the LD and the next-stage circuit substrate can be stably performed by reflow soldering accompanied by non-contact heating. (The bonding has so far been performed solely by hand soldering.) The amount of the supplied solder can be stabilized by using a metal mask for supplying the cream solder. Consequently, not only is the quality of the soldering itself stabilized but also the production process is streamlined and the mass production can be facilitated. In short, this system is effective both in quality improvement and in cost reduction.

(8) The optical communication module can also be tested electrically before being connected with the next-stage circuit substrate. This preliminary test prevents the defective modules from proceeding to the subsequent process. The absence of this preliminary test may result in the detection of defective modules after being completely connected with the next-stage circuit substrate, increasing the production cost considerably.

In addition, the present invention provides the resin encapsulation that encloses the exposed portions of the electroconductive media between the module and the next-stage circuit substrate. This resin encapsulation facilitates the impedance matching between the module and the next-stage circuit substrate, enabling high-speed operation.

EXAMPLE 2

Optical Transmitter Module Three Layers of Lead Frames

Figure 7:
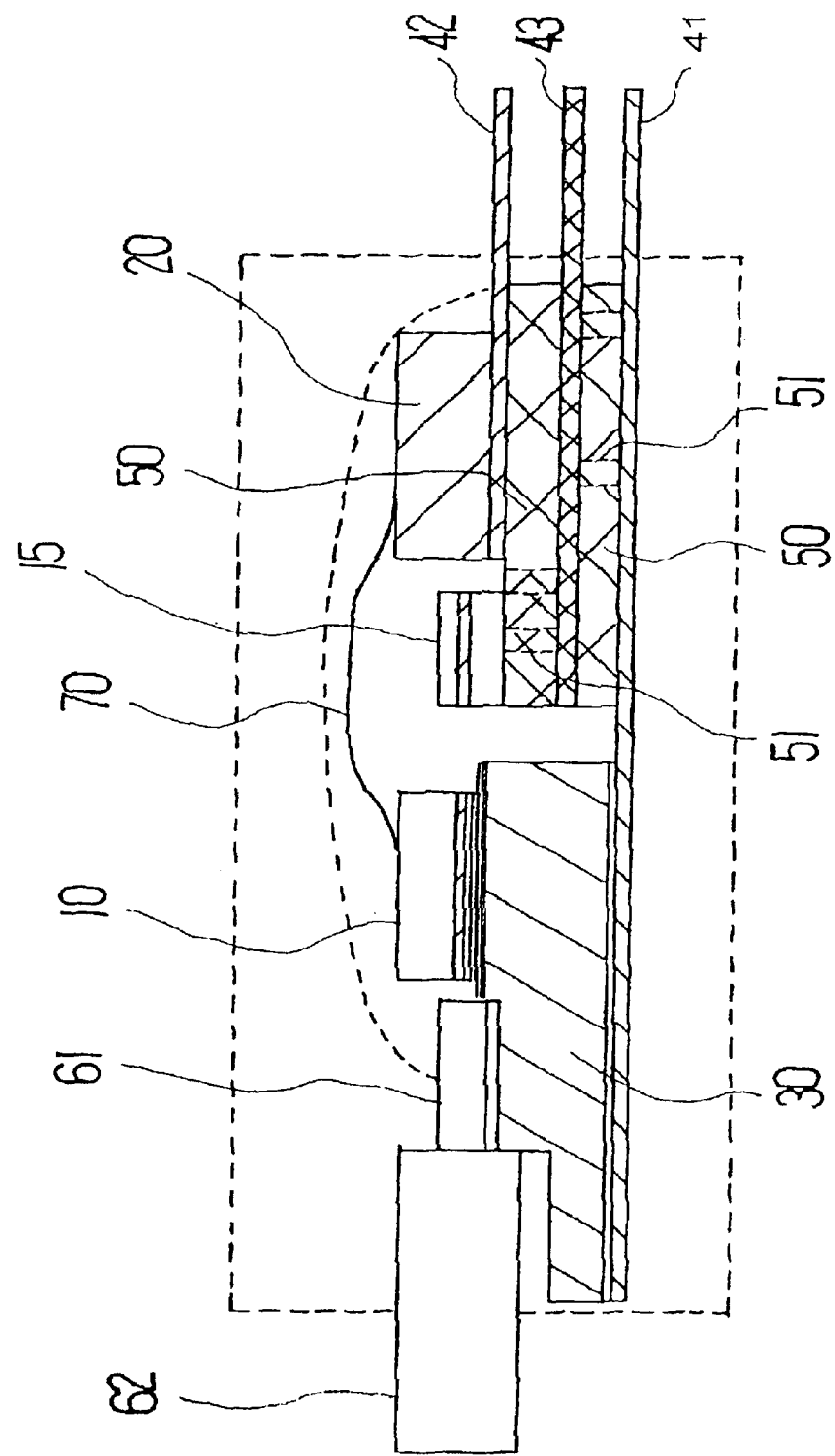
FIG. 7 is a longitudinal cross section of an optical communication module of the present invention having three layers of lead frames.
Figure 8:
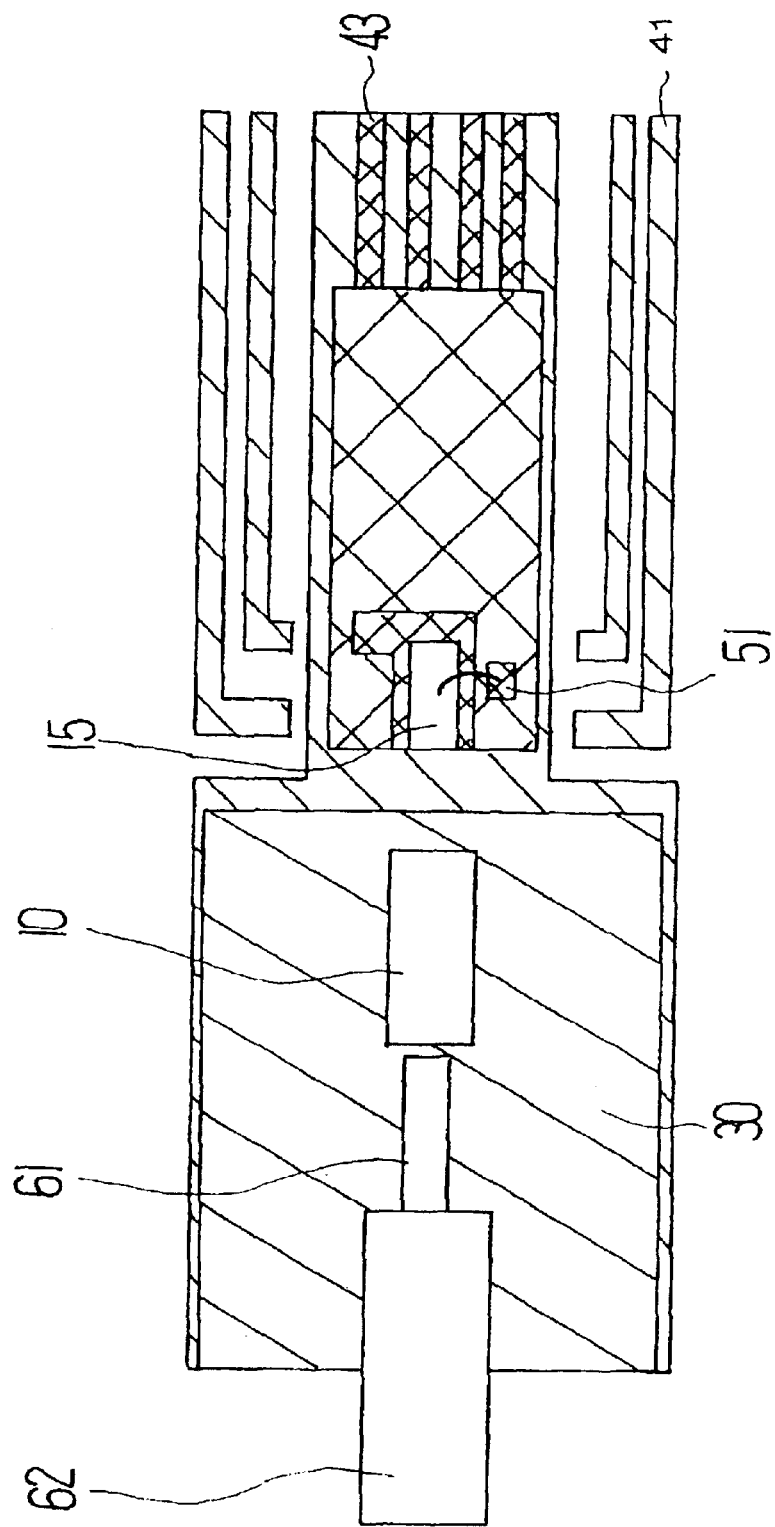
FIG. 8 is a plan view of the module shown in FIG. 7 from which the driver IC and the second lead frame are removed.
Figure 9:
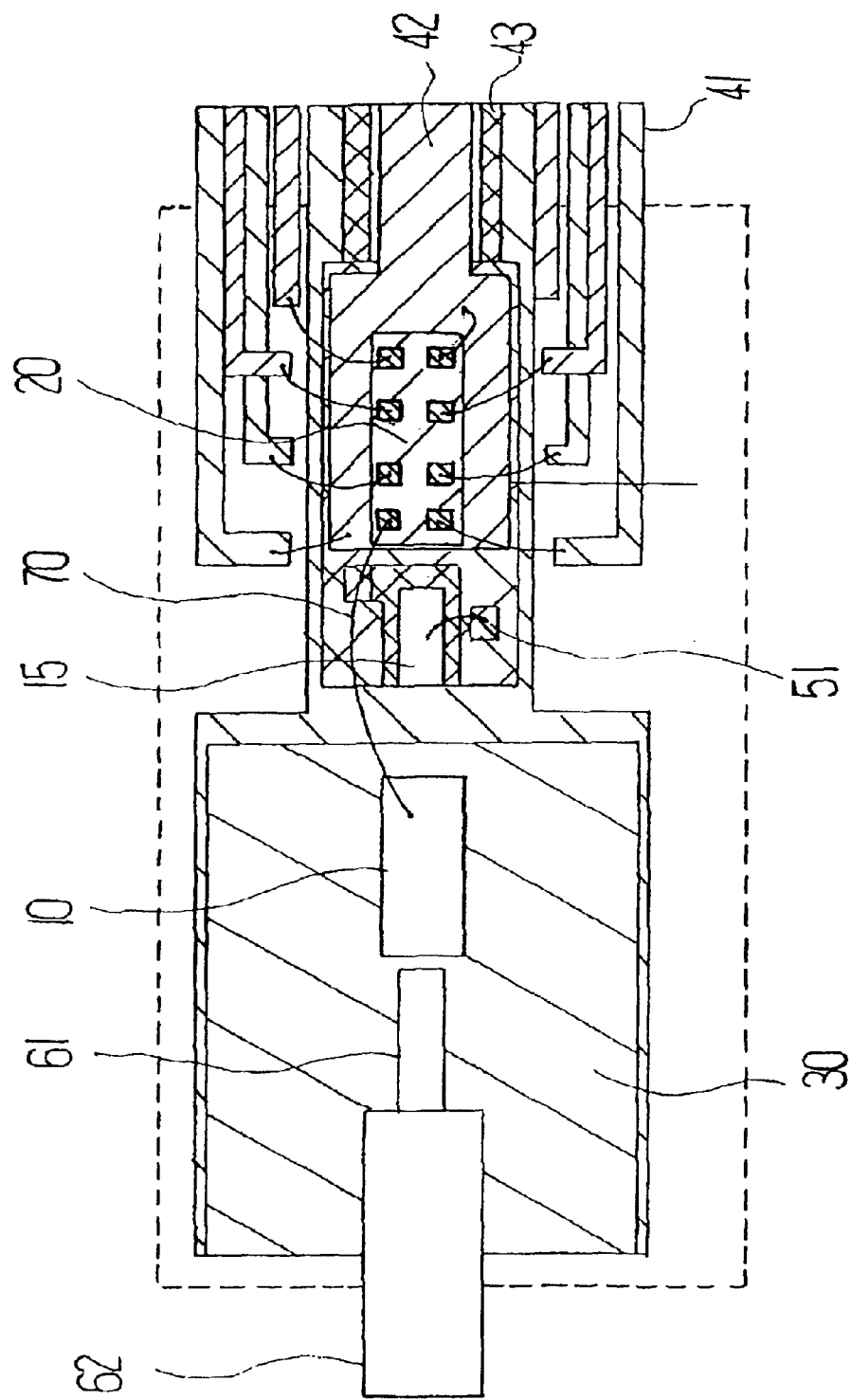
FIG. 9 is a plan view of the module shown in FIG. 7.

FIGS. 7 to 9 show an optical transmitter module of the present invention in which three layers of lead frames are used. FIG. 7 is a longitudinal cross section of the module. FIG. 8 is a plan view of the module shown in FIG. 7 from which the driver IC and the second lead frame are removed. FIG. 9 is a plan view of the module shown in FIG. 7.

An LD 10 is supported by a first lead frame 41 through an Si platform 30. A driver IC 20 is directly supported by a second lead frame 42. A third lead frame 43 is placed between the first lead frame 41 and the second lead frame 42. An insulating spacer 50 is placed between the first lead frame 41 and the third lead frame 43 and between the third lead frame 43 and the second lead frame 42.

This example differs from Example 1 in that three lead frames are provided so that an M-PD 15 for monitoring the light intensity of the LD 10 can be connected to the third lead frame 43 located at the middle position. The M-PD 15 is placed on the insulating spacer 50 and connected to the third lead frame 43 through an interlayer wiring system 51. As required, connections between the three lead frames are conducted through the interlayer wiring system 51. If constituting elements and devices to be mounted are increased, the number of lead-frame layers can be increased further and the shape of the lead pins can be changed as required.

Figure 10:
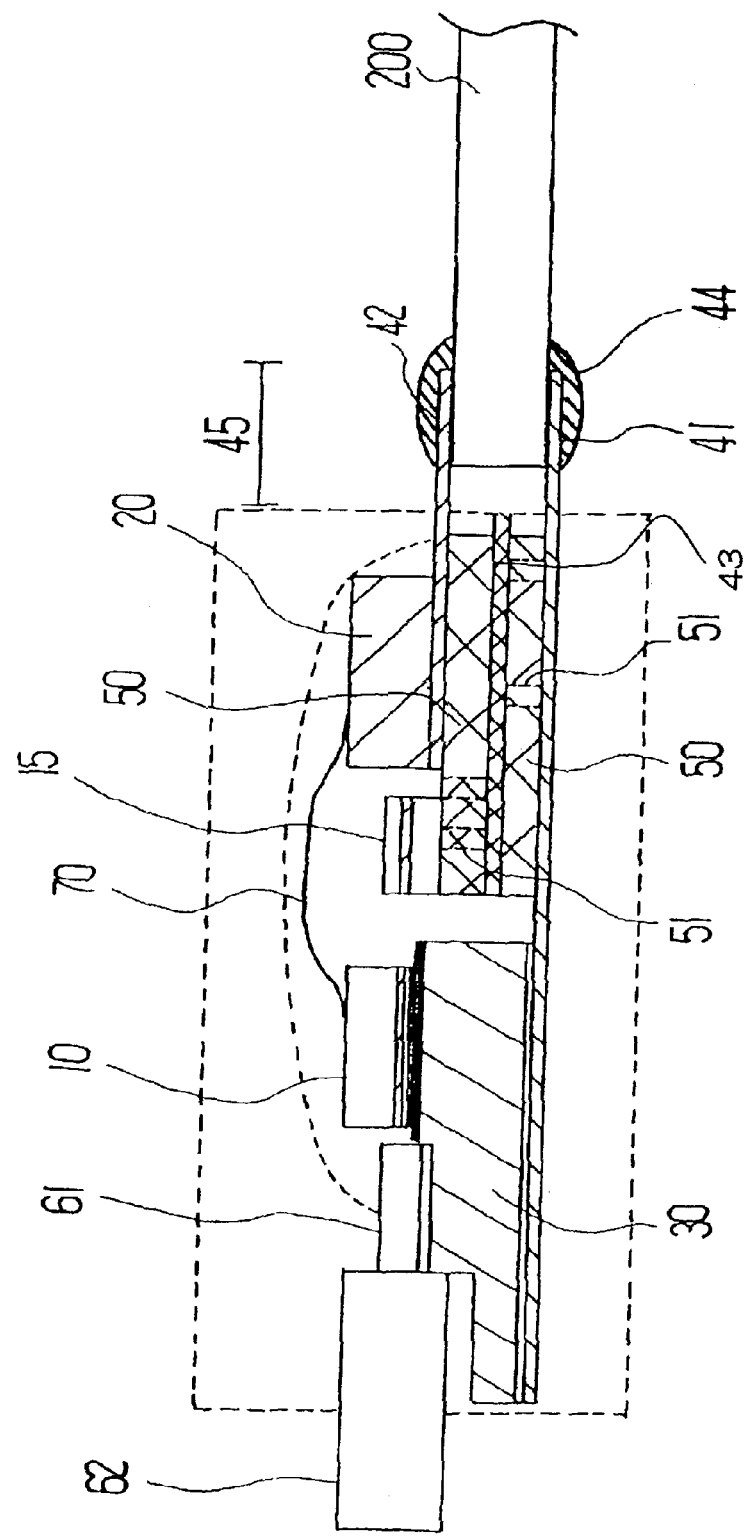
FIG. 10 is a longitudinal cross section showing the connection between an optical communication module of the present invention having three lead frames and a circuit substrate.
Figure 11:
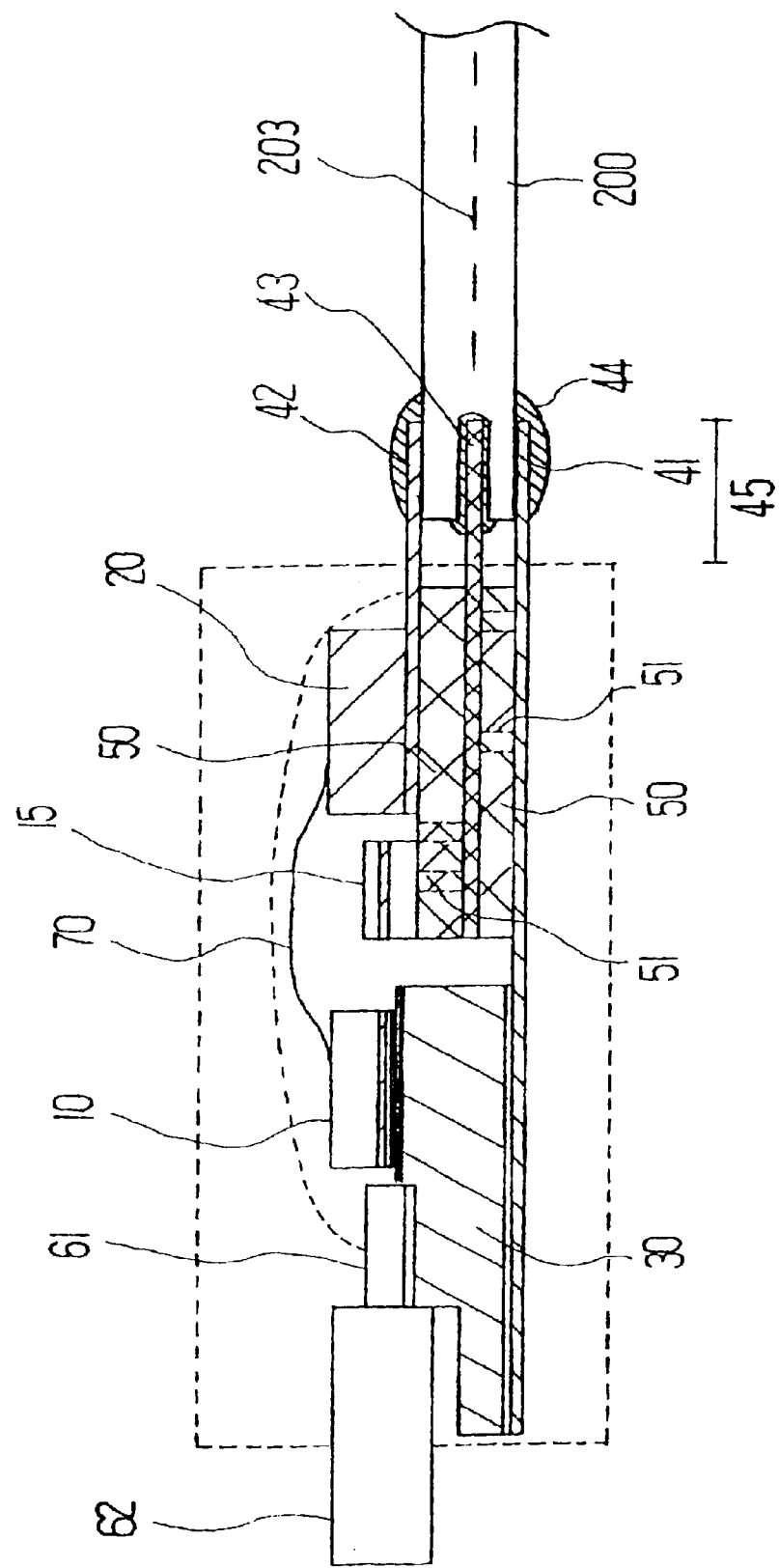
FIG. 11 is another longitudinal cross section showing the connection between an optical communication module of the present invention having three lead frames and a circuit substrate.

FIGS. 10 and 11 show methods of connecting the module with the next-stage circuit substrate. When all the circuits to be connected with the next-stage circuit substrate 200 can be provided by the two lead frames 41 and 42, the circuit substrate 200 can be inserted simply between the uppermost lead frame and the lowermost lead frame, as shown in FIG. 10. When the connection requires all three lead frames 41, 42, and 43, the method shown in FIG. 11 can be employed. More specifically, a three-circuit-layer circuit substrate 200 having a circuit pattern 203 in its interior is used. The substrate has slightly larger openings at the center of the end portion so that the connection of the circuit pattern 203 can be performed by pouring molten solder into the places for the connection with the connector portion 45.

EXAMPLE 3

Optical Receiver Module Two Layers of Lead Frames

Figure 12:
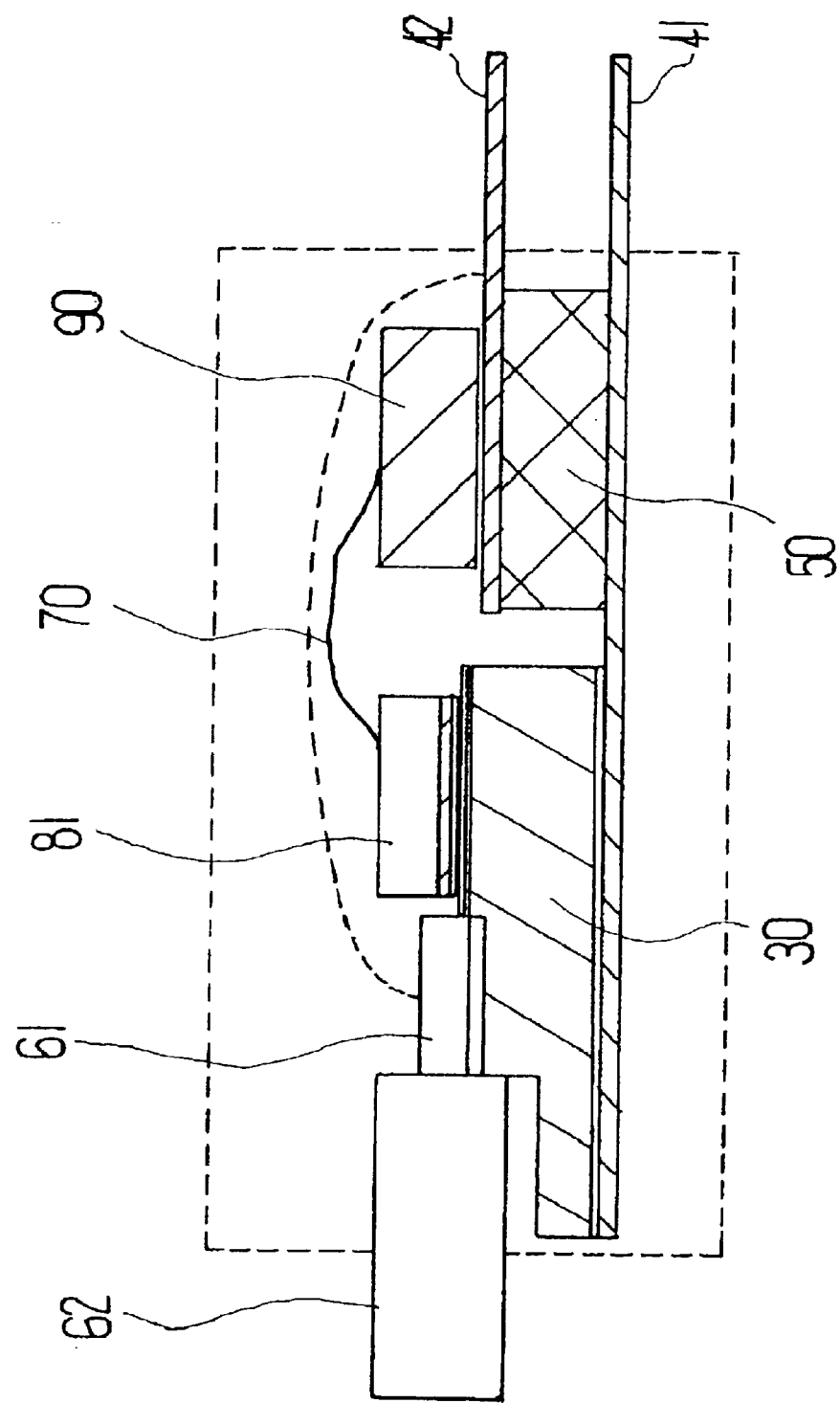
FIG. 12 is a longitudinal cross section of an optical receiver module of the present invention equipped with a waveguide-type PD.
Figure 13:
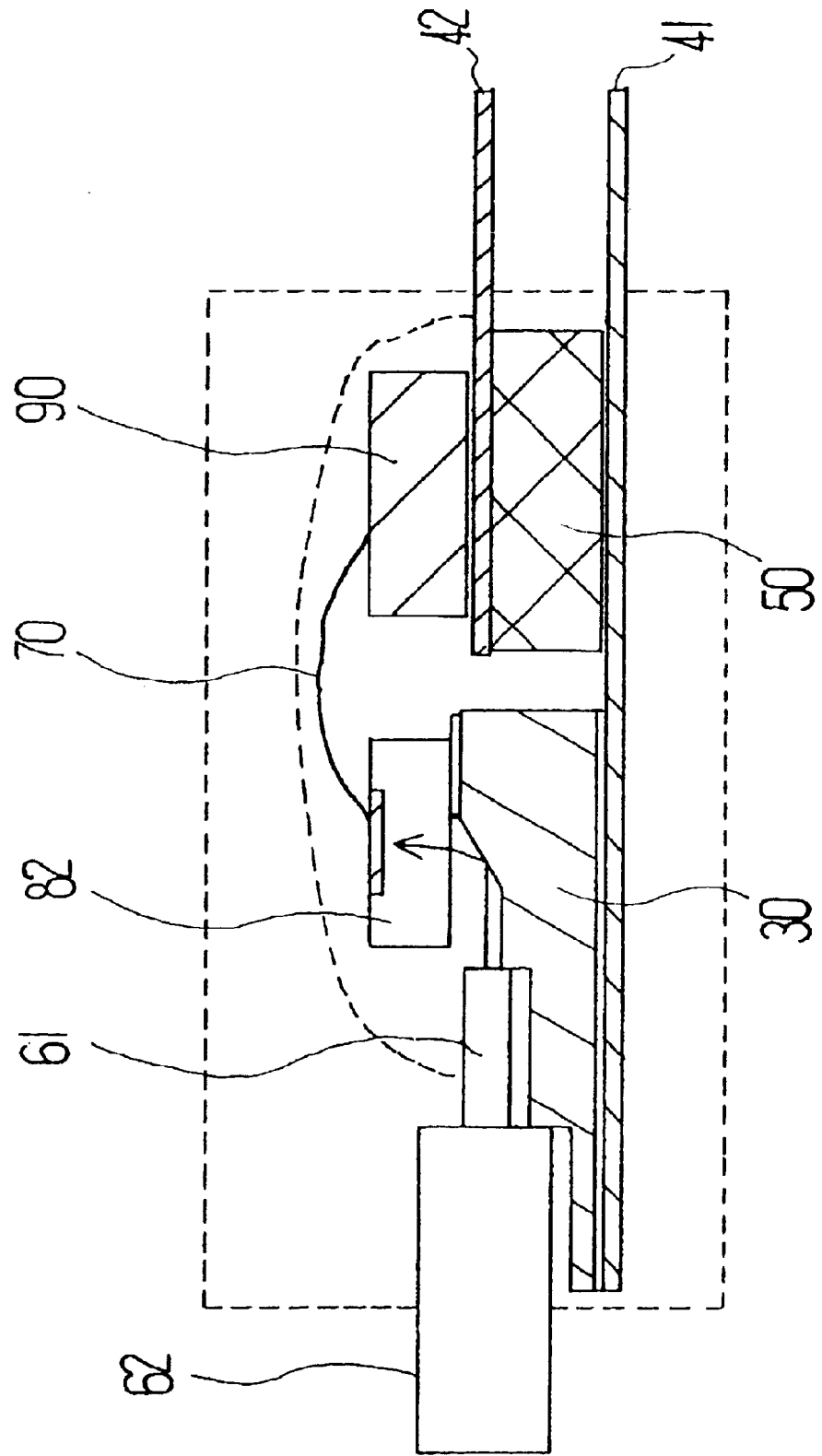
FIG. 13 is a longitudinal cross section of an optical receiver module of the present invention equipped with a back-illuminated-type PD.

FIGS. 12 and 13 show optical receiver modules of the present invention. FIG. 12 shows an optical receiver module in which a waveguide-type PD is used. In this structure, a waveguide-type PD 81 is used in place of the LD 10 used in Example 1, and an amplifier 90 is used in place of the driver IC 20. The other structure is basically the same as in Example 1. Although the amount of heat generated by the PD 81 is slight, the heat is dissipated from the first lead frame 41. The heat generated by the amplifier 90 is dissipated from the second lead frame 42.

FIG. 13 shows an optical receiver module in which a back-illuminated-type PD 82 is used. As with the case of an LD, V-shaped grooves for fixing the optical fiber and a metallized pattern for fixing the PD are formed on an Si platform 30. In order to allow light to enter the PD 82 at the back side, a slanted mirror portion is formed by anisotropic etching. An Au reflecting layer is formed on the mirror portion. The light having emerged from the optical fiber proceeds in the direction shown by the arrow, enters the PD 82 at the back side, and reaches the photo-sensitive area.

For use in a long-wavelength band of, for example, 1 to 1.6 $\mu$m, a PD in which an InGaAs photo-sensitive area is grown on an InP substrate is used. As an amplifier, an IC made with Si or GaAs is used.

The PD used in the structure shown in FIGS. 12 and 13 has an extremely temperature-sensitive dark current. Therefore, the superior heat-dissipating function of the present invention is remarkably effective in suppressing the dark current.

Figure 14:
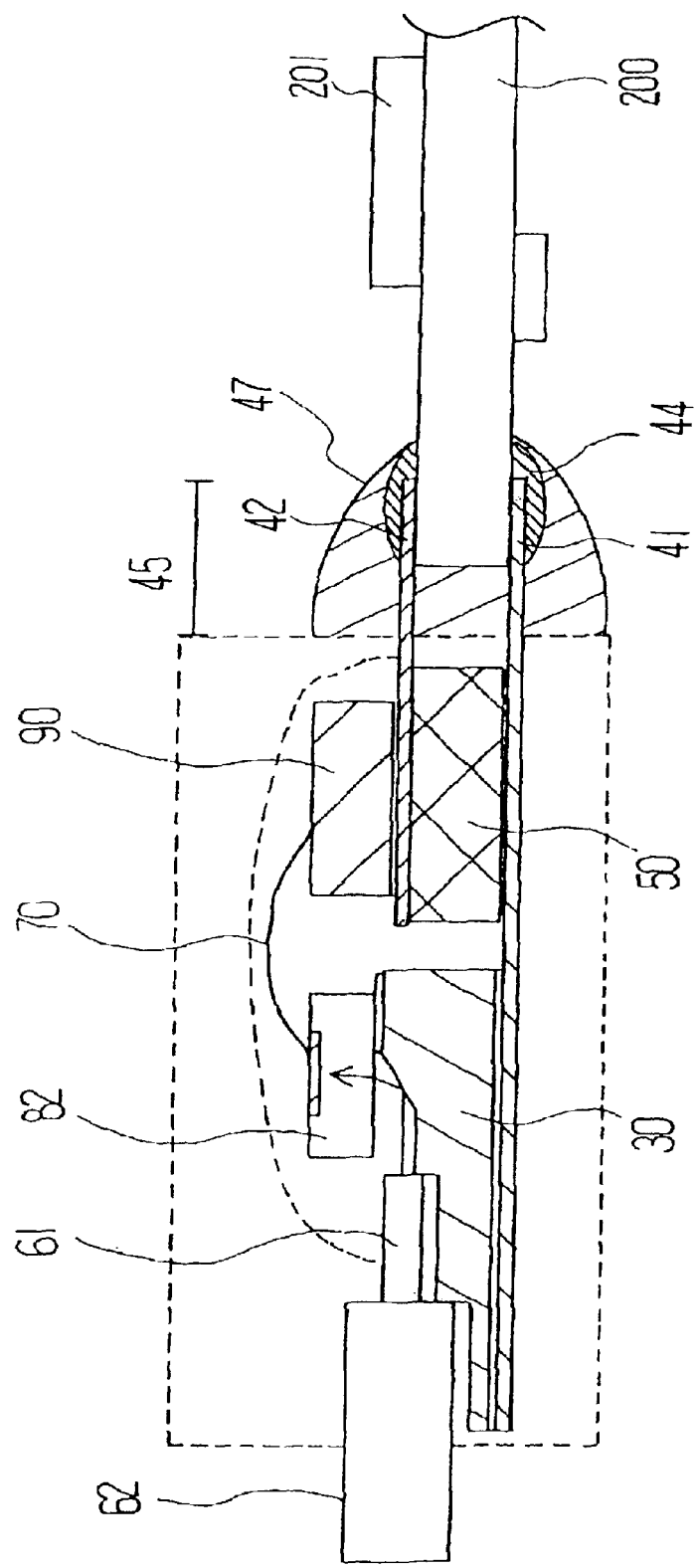
FIG. 14 is a longitudinal cross section showing the connection between an optical receiver module of the present invention equipped with a back-illuminated-type PD and a circuit substrate.

FIG. 14 shows a method of connecting the module shown in FIG. 13 with the next-stage circuit substrate. As with Example 1, this example has the following features:

(a) The end portions of both lead frames constitute connector portions 45, between which a circuit substrate 200 is inserted for the connection.

(b) The connector portions 45 and the circuit substrate 200 are connected at soldering portions 44.

(c) A resin-encapsulating portion 47 encloses the soldering portions 44 and the exposed portions of both lead frames between the package and the circuit substrate 200.

(d) The circuit substrate 200 has the same structure as explained in Example 1.

EXAMPLE 4

Optical Transceiver Module Two Optical Fibers

Figure 15:
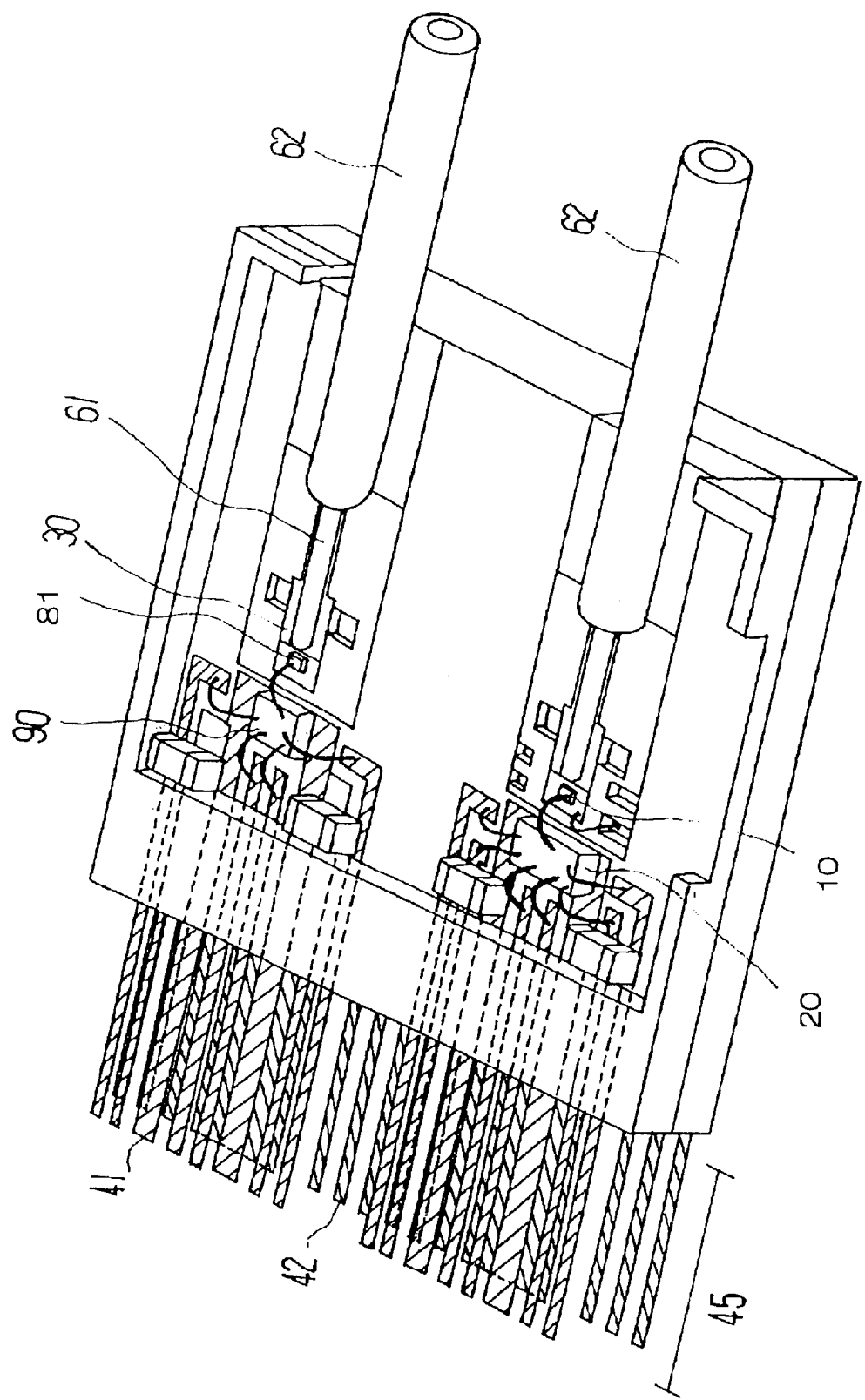
FIG. 15 is a perspective view of an optical transceiver module of the present invention incorporating two optical fibers.
Figure 16:
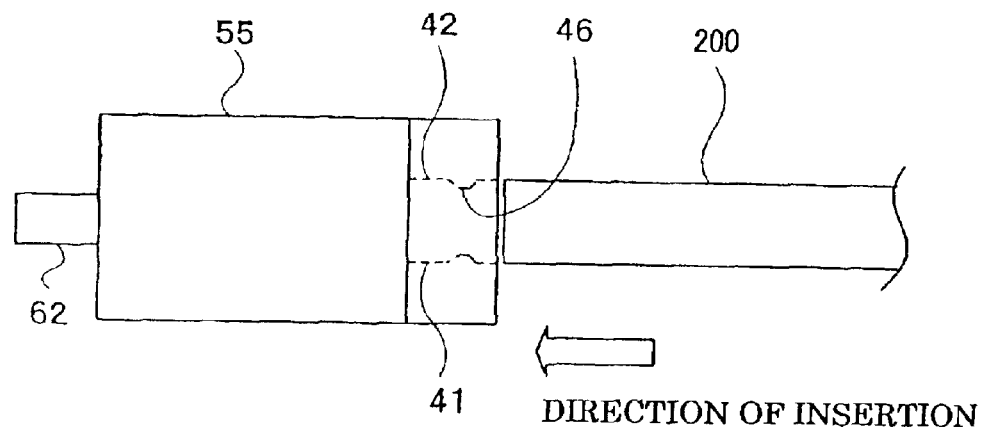
Figure 16:
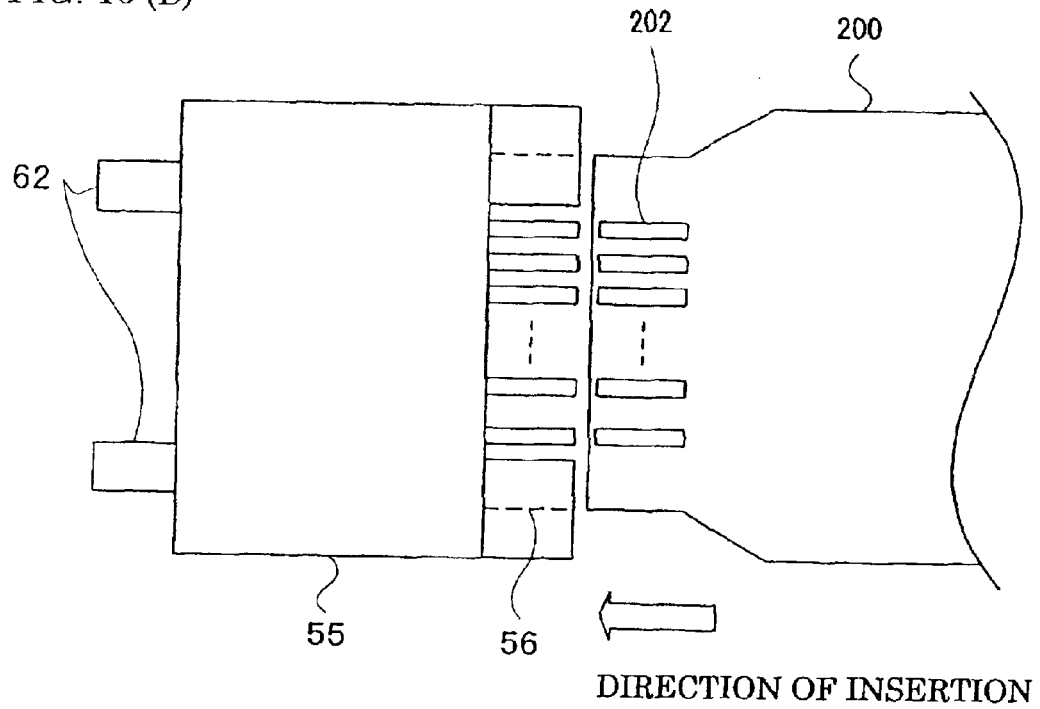

FIG. 15 shows an optical transceiver module in which two optical fibers are used and all lead frames protrude in the same direction. FIGS. 16(A) and 16(B) show the procedure for connecting the optical communication module of this example with the next-stage circuit substrate. FIGS. 16(A) and 16(B) are the same as FIGS. 5(A) and 5(B) shown in Example 1 except that FIG. 16(B) has two optical fiber ferrules 62.

This optical transceiver module has a structure in which the optical transmitter module shown in FIG. 1 is basically juxtaposed with the optical receiver module shown in FIG. 12 or 13. As shown in FIG. 15, two layers of lead frames 41 and 42 are used. The lead frame 41 and the lead frame 42 are placed on the top face and the underface of a base made of a liquid crystal polymer, respectively. Each of the signal-transmitting portion and the signal-receiving portion has one optical fiber. The lead frames 41 and 42 of each portion protrude in the same direction. The total number of lead pins for the signal transmission and reception is 32 (16 lead pins multiplied by 2 layers). They are effectively used for the signal circuits, grounding circuits, and heat dissipation, notably exerting the effects of the present invention. The method of connecting with the next-stage circuit substrate is much the same as in Examples 1 to 3. More specifically, the connection is performed by inserting the circuit substrate between the connector portions 45 provided at the end portions of the two lead frames.

Figure 17:
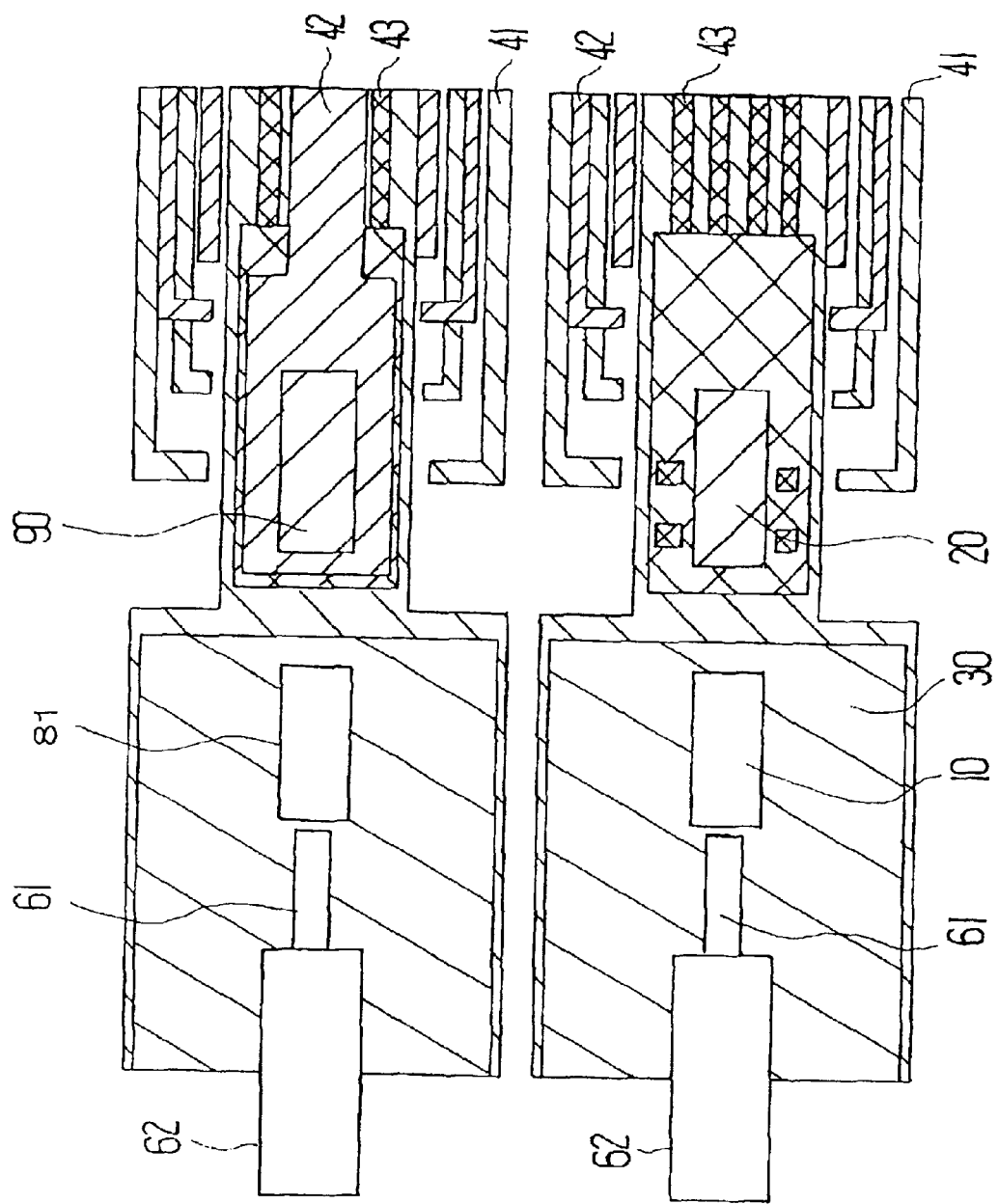
FIG. 17 is a plan view of an optical transceiver module incorporating two optical fibers and three lead frames.

FIG. 17 shows another example of an optical transceiver module in which three lead frames are used. FIG. 17 is a plan view of the circuit structure of this example.

The present invention can also be applied to a device known as a parallel data link that simultaneously transmits a plurality of signals between computers. In this system, for example, the signal-transmitting portion has 12 LDs and 12 driver ICs, and the signal-receiving portion has 12 PDs and 12 amplifiers. The superior heat dissipating function of the present invention is remarkably effective in such a highly integrated structure.

EXAMPLE 5

Optical Transceiver Module One Optical Fiber

Figure 18:
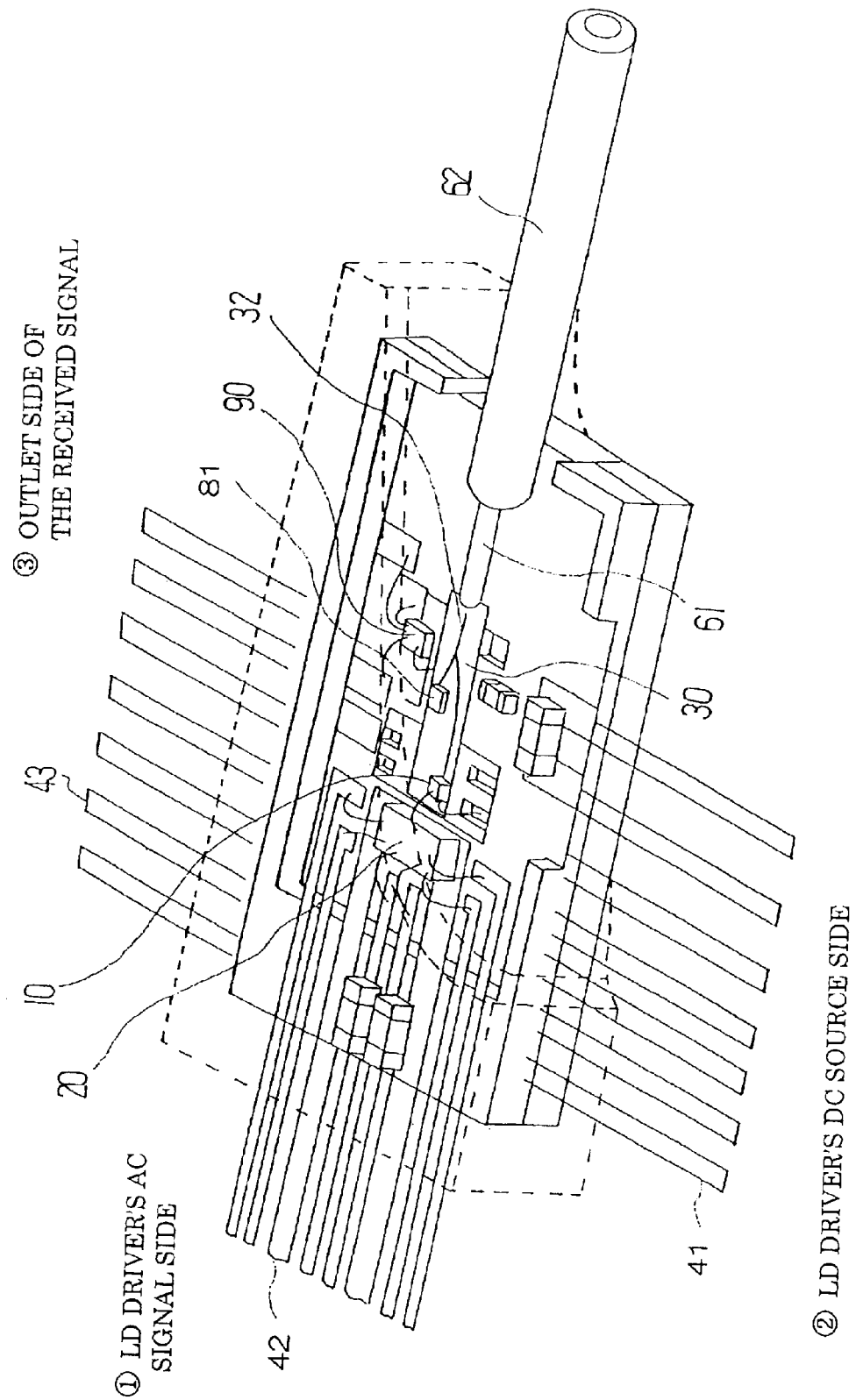
FIG. 18 is a perspective view of an optical transceiver module of the present invention incorporating one optical fiber.
Figure 19:
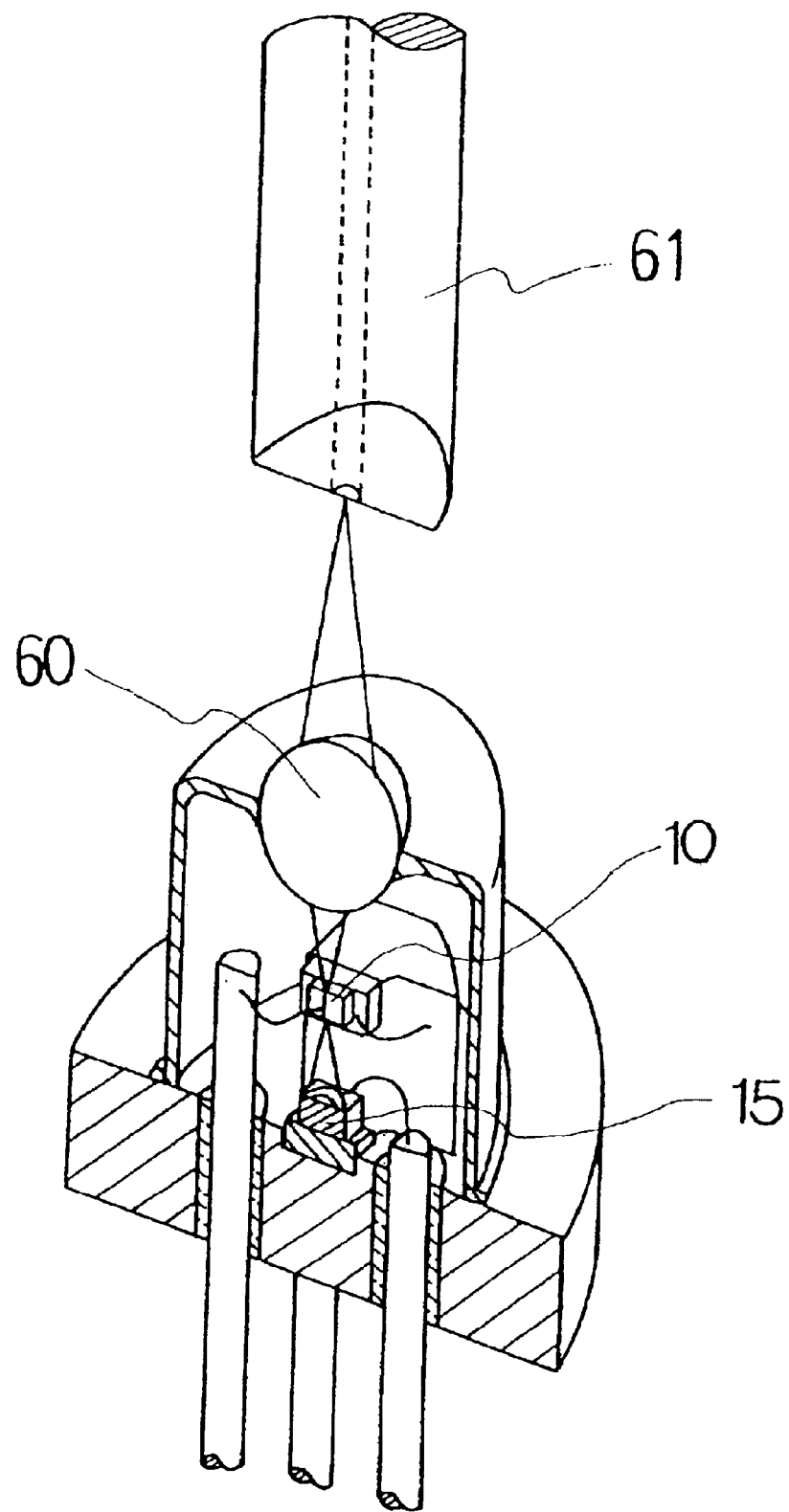
FIG. 19 is a partially cutaway perspective view of a conventional optical transmitter module.
Figure 20:
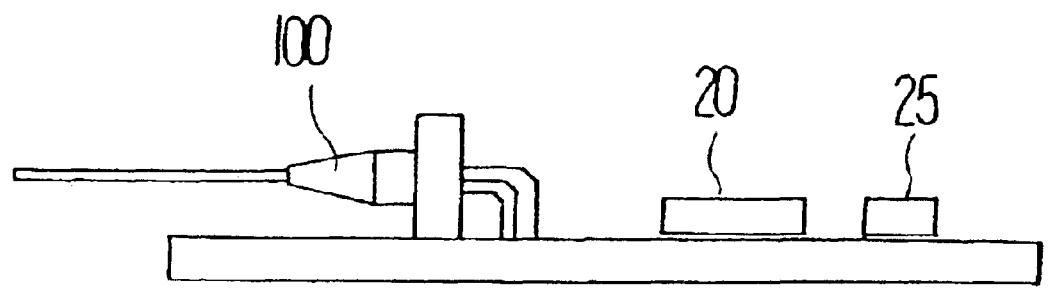
FIG. 20 is an illustration showing a conventional optical transmitter module mounted on a substrate.

FIG. 18 shows an optical transceiver module in which one optical fiber is used for signal transmission and reception, and each lead frame protrudes in a different direction. FIG. 18 shows a perspective view of this optical transceiver module.

In this optical transceiver module, an optical wavelength demultiplexer 32 composed of a wavelength-selective branching waveguide is provided by forming an $SiO_2$ layer on an Si platform 30. This wavelength-demultiplexing system enables both transmission and reception of signals through one optical fiber. In this system, the optical waveguides of an LD 10 and a PD 81 are placed in close proximity. The module receives light having a wavelength of 1.55 $\mu$m and transmits light having a wavelength of 1.3 $\mu$m.

This optical transceiver module has three lead frames. As shown in FIG. 18, the neighboring lead frames protrude in a direction different from each other by 90 degrees. In order to avoid the interference between the electric circuits, a driver IC 20 for the LD 10 is connected to an upper lead frame 42, which protrudes from the rear side of the module (the LD driver's AC signal side ①). Some terminals of the driver IC 20 are connected to a lower lead frame 41, which protrudes from the viewer's side of the module (the LD driver's dc source side ②). The signal receiving circuit, which is most sensitive to electrical noises, is connected to a lead frame 43. Although the lead frame 43 is placed on the same plane as the lead frame 41, the electric circuits for the two lead frames are separated. The lead frame 43 is placed so as to be perpendicular to the lead frame 42 for the driver IC 20 of the LD 10, which handles the most intense signals, in order to minimize the electromagnetic coupling. The position of the lead frame 43 is indicated as the "outlet side of the received signal ③" in FIG. 18.

As described above, the present invention offers a structure in which both transmission and reception of signals can be performed through one optical fiber by dividing the light pathway. In other words, the application of the present invention is not limited by the number of optical fibers. FIG. 18 shows a unit of an optical transceiver module in which one optical fiber is combined with an LD and a PD. As a matter of course, an optical transceiver module may comprise a plurality of such units.

As explained above, an optical communication module of the present invention has the following features:

(a) The layered electroconductive media function as a means of connecting the module and the next-stage circuit substrate both electrically and mechanically. The number of lead pins for this connection can be secured. The structure for this connection can be miniaturized considerably.

(b) The short distance between the optoelectronic device (such as a light-emitting device or a light-receiving device) and the accompanying electric-circuit part decreases the impedance of the wiring circuits, facilitating high-speed signal transmissions at a rate of 1 Gbps or more.

(c) The optoelectronic device and the electric-circuit part can be isolated thermally, because the heat generated by the optoelectronic device is dissipated through a first electroconductive medium and the heat generated by the electric-circuit part is dissipated through a second electroconductive medium.

(d) The connection between the module and the next-stage circuit substrate can be performed by soldering accompanied by non-contact heating. A typical example is the reflow soldering method. As a result, the soldering is stabilized in quality, the production process is streamlined, and mass production can be facilitated.

What is claimed is:

1. An optical communication module comprising:
   (a) a plurality of electroconductive media each of which:
      (a1) comprises a lead frame;
      (a2) forms a multilayer structure with another electroconductive medium or media; and
      (a3) protrudes from the main body of the optical communication module;
   (b) at least one optoelectronic device selected from the group consisting of at least one light-emitting device and at least one light-receiving device, the at least one optoelectronic device being supported by one of the electroconductive media;
   (c) an electric-circuit part being:
      (c1) supported by one of the electroconductive media; and
      (c2) connected to the optoelectronic device or each optoelectronic device; and
   (d) an optically coupling means being:
      (d1) supported by one of the electroconductive media; and
      (d2) coupled optically with the optoelectronic device or each optoelectronic device.

2. An optical communication module as defined in claim 1, further comprising a connector portion that:
   (a) is formed at the end portion of each of the electroconductive media; and
   (b) is to be connected to the next-stage circuit substrate.

3. An optical communication module as defined in claim 2, wherein the electroconductive media are lead frames.

4. An optical communication module as defined in claim 2, wherein the optically coupling means is an optical fiber.

5. An optical communication module as defined in claim 2, further comprising a guiding structure that prevents the next-stage circuit substrate from shifting in a direction perpendicular to the protruding direction of the plurality of electroconductive media.

6. An optical communication module as defined in claim 2, wherein:
   (a) the optically coupling means is an optical fiber inserted into a ferrule (hereinafter referred to as a ferruled optical fiber);
   (b) the plurality of electroconductive media are two layers of lead frames; and
   (c) the connector portion is formed to accommodate a next-stage circuit substrate can be securely inserted between the end portions of the lead frames.

7. An optical communication module as defined in claim 2, further comprising at least one Si platform that is supported by one of the electroconductive media, wherein
   (a) the optically coupling means is a ferruled optical fiber; and
   (b) one end of the ferruled optical fiber is fixed on the Si platform together with each of the at least one optoelectronic device.

8. An optical communication module as defined in claim 2, wherein:
   (a) the at least one light-emitting device is a laser diode; and
   (b) the electric-circuit part connected to the laser diode is a driver integrated circuit.

9. An optical communication module as defined in claim 2, wherein:
   (a) the at least one light-receiving device is a photodiode; and
   (b) the electric-circuit part connected to the photodiode is a signal amplifier.

10. An optical communication module as defined in claim 2, wherein:
    (a) the at least one light-emitting device is a laser diode;
    (b) the electric-circuit part connected to the laser diode is a driver integrated circuit.
    (c) the at least one light-receiving device is a photodiode; and
    (d) the electric-circuit part connected to the photodiode is a signal amplifier.

11. An optical communication module as defined in claim 10, being further defined by that:
    (a) the electroconductive media are two layers of lead frames;
    (b) the optically coupling means is an optical fiber;
    (e) the laser diode and the optical fiber coupled optically with the laser diode are supported by a part of a first lead frame;
    (d) the driver integrated circuit is supported by a part of a second lead frame;
    (e) the photodiode and the optical fiber coupled optically with the photodiode are supported by the remaining part of the first lead frame;
    (f) the signal amplifier is supported by the remaining part of the second lead frame;
    (g) the combination of the laser diode, the optical fiber coupled optically with the laser diode, and the driver integrated circuit forms a signal-transmitting portion;
    (h) the combination of the photodiode, the optical fiber coupled optically with the photodiode, and the signal amplifier forms a signal-receiving portion;
    (i) the optical communication module further comprises a resin-molding portion enclosing the signal-transmitting portion and the signal-receiving portion for forming a package; and
    (j) the connector portion protrudes from the package.

12. An optical communication module as defined in claim 1, being further defined by that:
    (a) there are two layers of the electroconductive media;
    (b) the at least one optoelectronic device is supported by said one of the electroconductive media;
    (c) the electric-circuit part is supported by said another of the electroconductive media; and
    (d) the module further comprises an electric insulator sandwiched between said one and said another of the electroconductive media.

13. An optical communication module as defined in claim 1, wherein there are at least three layers of the electroconductive media.

14. An optical communication module as defined in claim 12, wherein there are at least two optoelectronic devices incorporated into the module.

15. An optical communication module as defined in claim 12, wherein the electroconductive media are metal lead frames.

16. An optical communication module as defined in claim 12, being further defined by that:
    (a) the module further comprises at least one Si platform;
    (b) the at least one optoelectronic device is supported by said one of the electroconductive media through the Si platform;
    (c) the electric-circuit part is supported directly by said another of the electroconductive media; and
    (d) the electric insulator has a thermal insulation property.

17. An optical communication module as defined in claim 12, wherein:
    (a) there are at least two light-emitting devices incorporated into the module;
    (b) the light-emitting devices are laser diodes; and
    (c) the electric-circuit part connected to each of the laser diodes are driver integrated circuits.

18. An optical communication module as defined in claim 12, wherein:
    (a) there are at least two light-receiving devices incorporated into the module;
    (b) the light-receiving devices are photodiodes; and
    (c) the electric-circuit parts connected to the photodiodes are signal amplifiers.

19. An optical communication module as defined in claim 12, wherein:
    (a) the at least one light-emitting device is an laser diode;
    (b) the electric-circuit part connected to the laser diode is a driver integrated circuit;
    (c) the at least one light-receiving device is a photodiode; and
    (d) the electric-circuit part connected to the photodiode is a signal amplifier.

20. An optical communication module as defined in claim 12, wherein said one and said another of the electroconductive media protrude in a direction different from each other.

* * * * *

UNITED STATES PATENT AND TRADEMARK OFFICE
CERTIFICATE OF CORRECTION

PATENT NO. : 6,808,316 B2
APPLICATION NO. : 10/176355
DATED : October 26, 2004
INVENTOR(S) : Hiromi Nakanishi et al.

It is certified that error appears in the above-identified patent and that said Letters Patent is hereby corrected as shown below:

In claim 6, column 19, line 9, delete the words "can be".

In claim 11, column 19, line 48, change "(e)" to --(c)--.

Signed and Sealed this

Twenty-fifth Day of July, 2006

JON W. DUDAS
*Director of the United States Patent and Trademark Office*